United States Patent
Stanley et al.

(10) Patent No.: US 7,180,306 B2
(45) Date of Patent: Feb. 20, 2007

(54) AUTOMOTIVE SYSTEMS

(75) Inventors: James G. Stanley, Novi, MI (US); Robert A. Stopper, Plymouth, MI (US)

(73) Assignee: Automotive Systems Laboratory, Inc., Farmington Hills, MI (US)

( * ) Notice: Subject to any disclaimer, the term of this patent is extended or adjusted under 35 U.S.C. 154(b) by 0 days.

(21) Appl. No.: 10/987,318

(22) Filed: Nov. 15, 2004

(65) Prior Publication Data

US 2005/0128082 A1    Jun. 16, 2005

Related U.S. Application Data

(60) Division of application No. 10/153,378, filed on May 21, 2002, now Pat. No. 6,825,765, which is a continuation-in-part of application No. 09/474,470, filed on Dec. 29, 1999, now Pat. No. 6,577,023, said application No. 10/153,378 is a continuation-in-part of application No. 09/474,469, filed on Dec. 29, 1999, now Pat. No. 6,563,231, said application No. 10/153, 378 is a continuation-in-part of application No. 09/614,086, filed on Jul. 11, 2000, now Pat. No. 6,392,542, and a continuation-in-part of application No. 09/474,673, filed on Dec. 29, 1999, now Pat. No. 6,283,504, and a continuation-in-part of application No. 09/474,600, filed on Dec. 29, 1999, now Pat. No. 6,520,535.

(60) Provisional application No. 60/207,536, filed on May 26, 2000, provisional application No. 60/144,161, filed on Jul. 15, 1999, provisional application No. 60/143,761, filed on Jul. 12, 1999, provisional application No. 60/133,630, filed on May 11, 1999, provisional application No. 60/133,632, filed on May 11, 1999, provisional application No. 60/114,269, filed on Dec. 30, 1998.

(51) Int. Cl.
*G01R 27/26*    (2006.01)
*G01R 29/12*    (2006.01)

(52) U.S. Cl. .................................... 324/686; 324/457

(58) Field of Classification Search ................ 324/660, 324/686, 684, 663, 457; 280/735; 340/562
See application file for complete search history.

(56) References Cited

U.S. PATENT DOCUMENTS

| 5,633,594 A | * | 5/1997 | Okada | ......................... 324/679 |
| 5,914,610 A | * | 6/1999 | Gershenfeld et al. | ........ 324/663 |
| 6,043,743 A | * | 3/2000 | Saito et al. | ................. 340/562 |

* cited by examiner

*Primary Examiner*—Anjan Deb
(74) *Attorney, Agent, or Firm*—Foley & Lardner, LLP

(57) ABSTRACT

An occupant detection system includes a weight sensor and an electric field sensor, each operatively coupled to a seat. The electric field sensor generates an electric field from at least one electrode in the bottom of the seat, provides for generating a response to an influence of the occupant, and is adapted to discriminate the response of a seated infant or child seating condition from another seating condition. If a measure of weight from the weight sensor is less than a threshold, or if a child seating condition is detected by the electric field sensor, then a signal processor provides for disabling an associated restraint actuator. The electric field sensor may include a plurality of electrodes over first and second regions of differing proximity to a seated infant or child, or at least one electrode in cooperation with a shield or void over at least one of the regions.

15 Claims, 12 Drawing Sheets

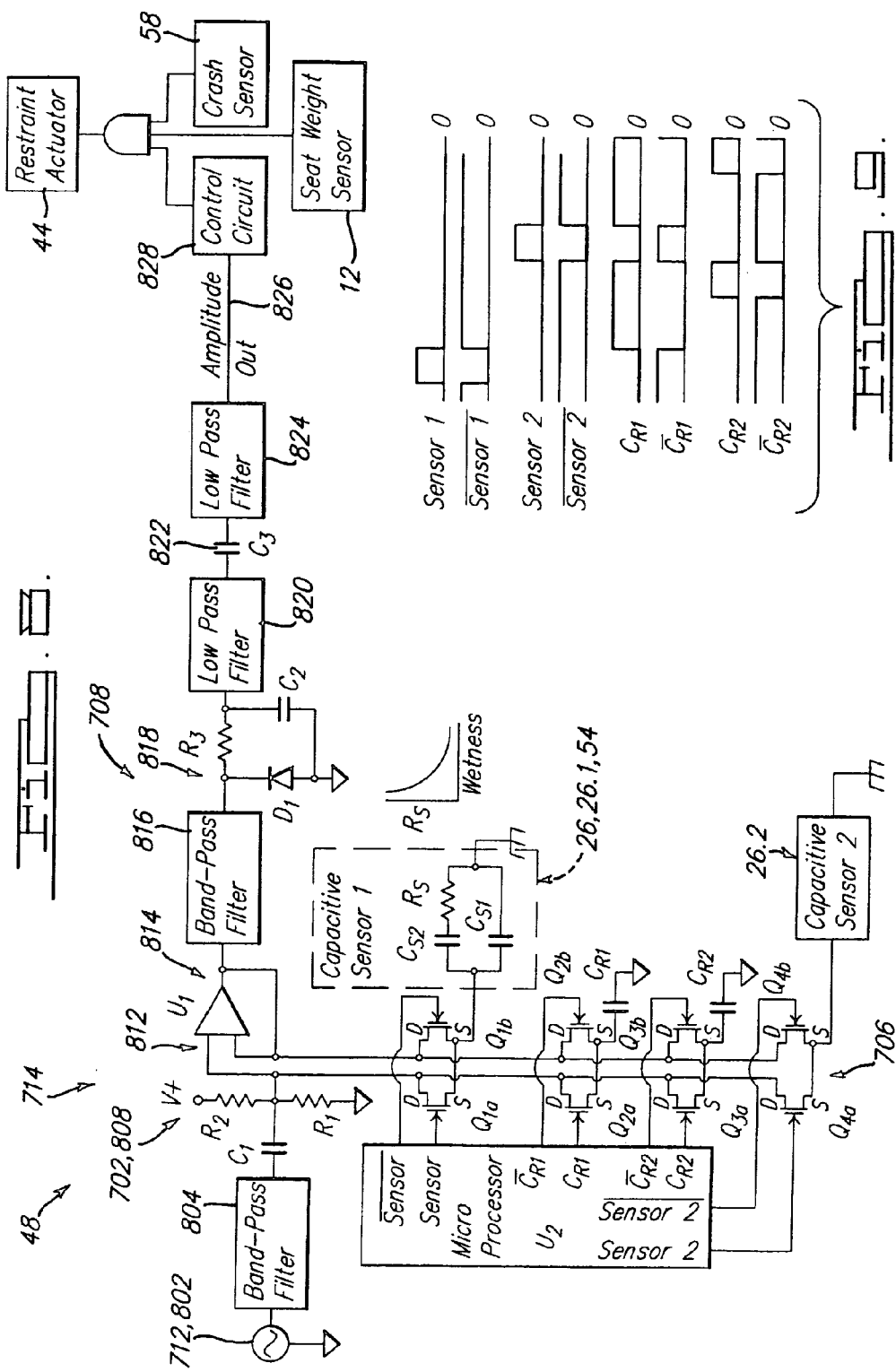

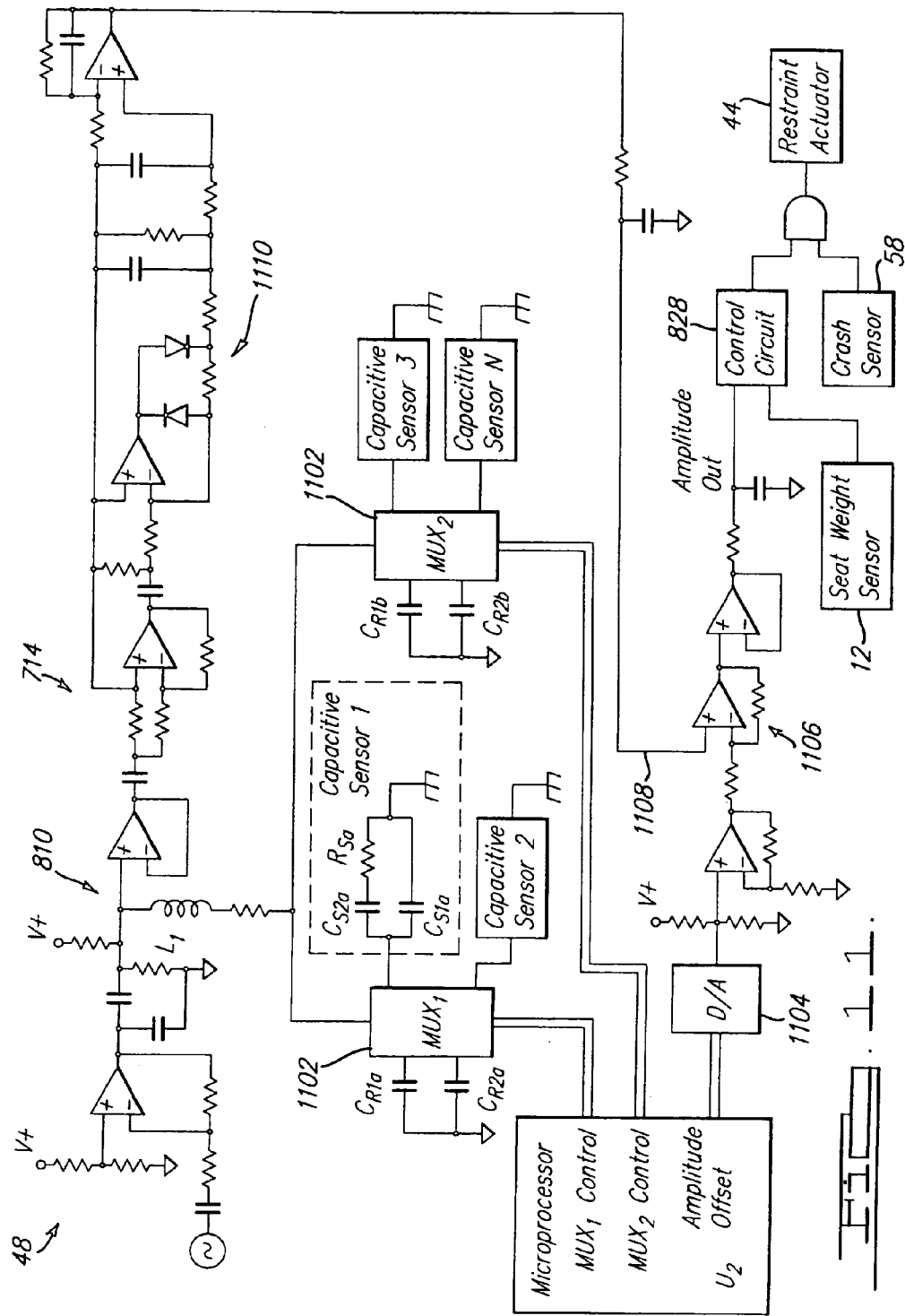

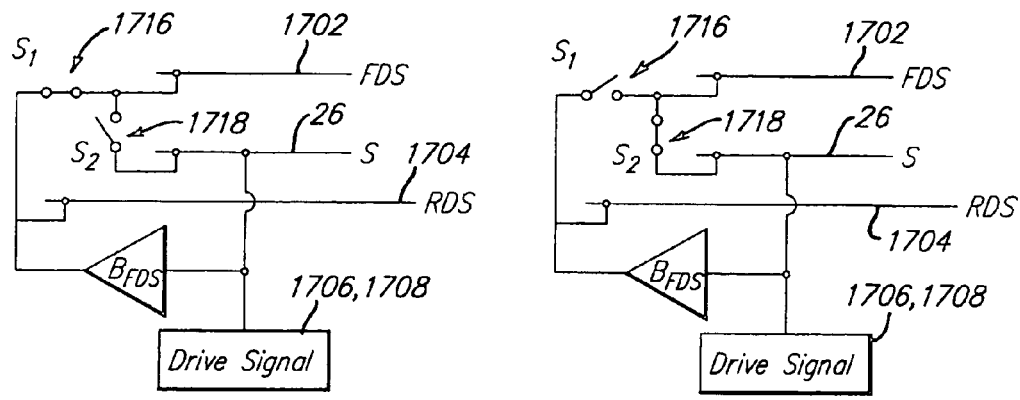
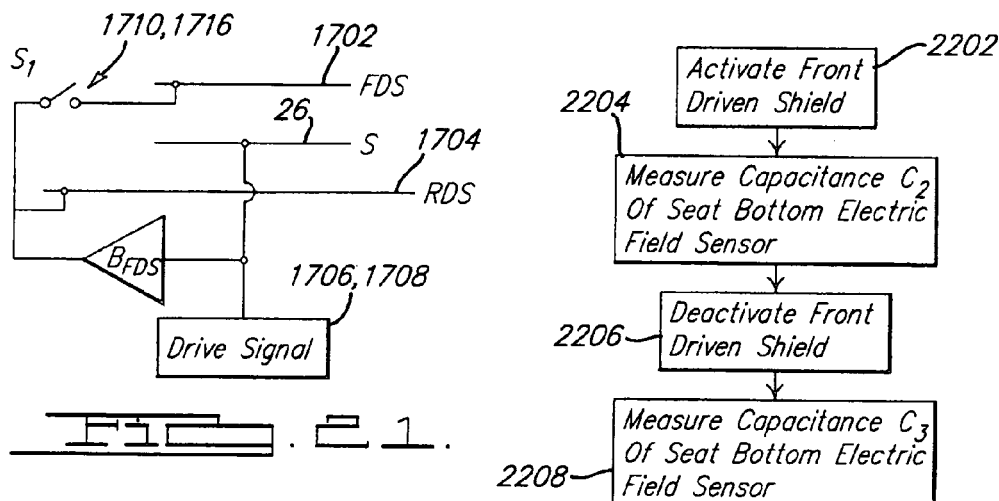
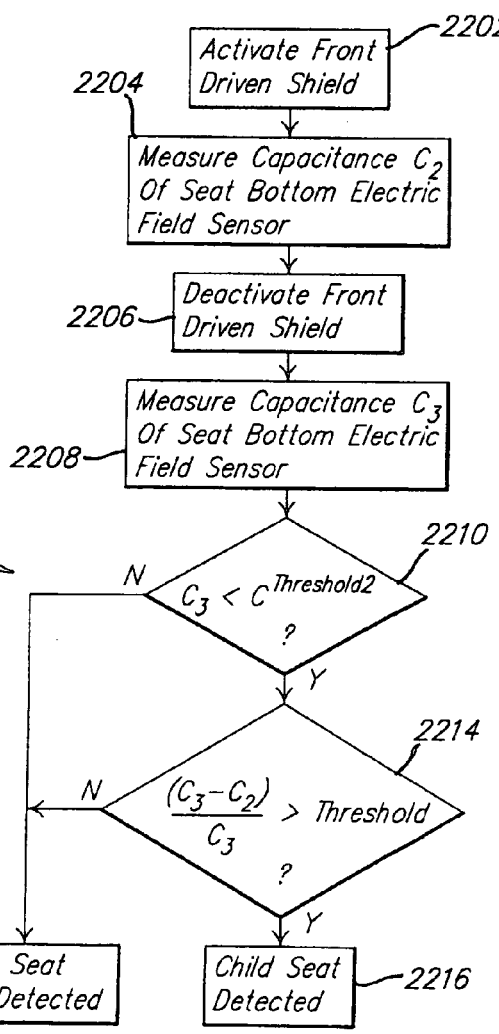

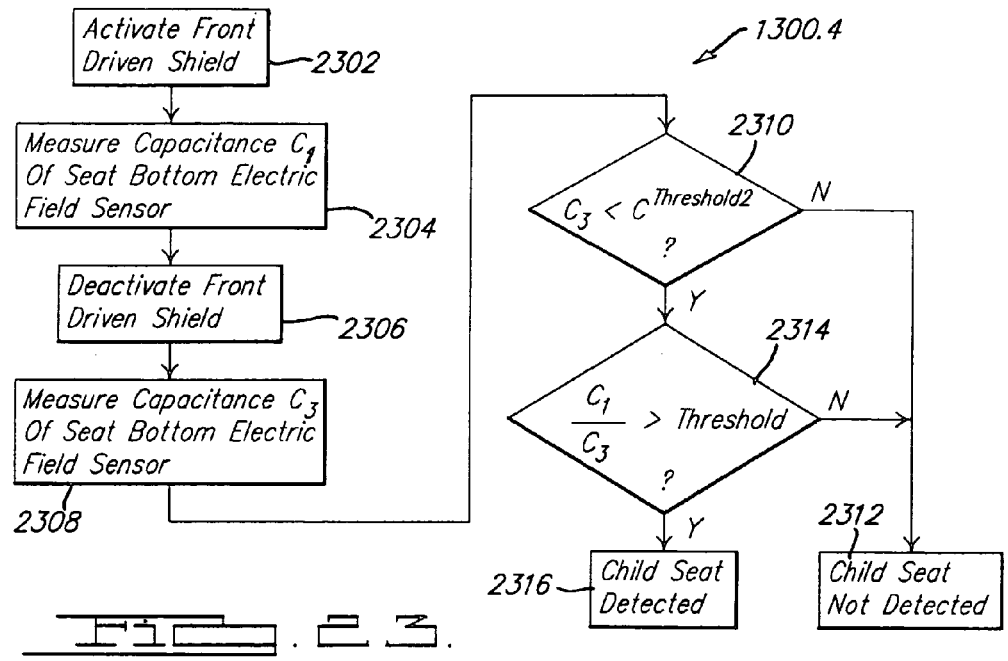
FIG. 23.
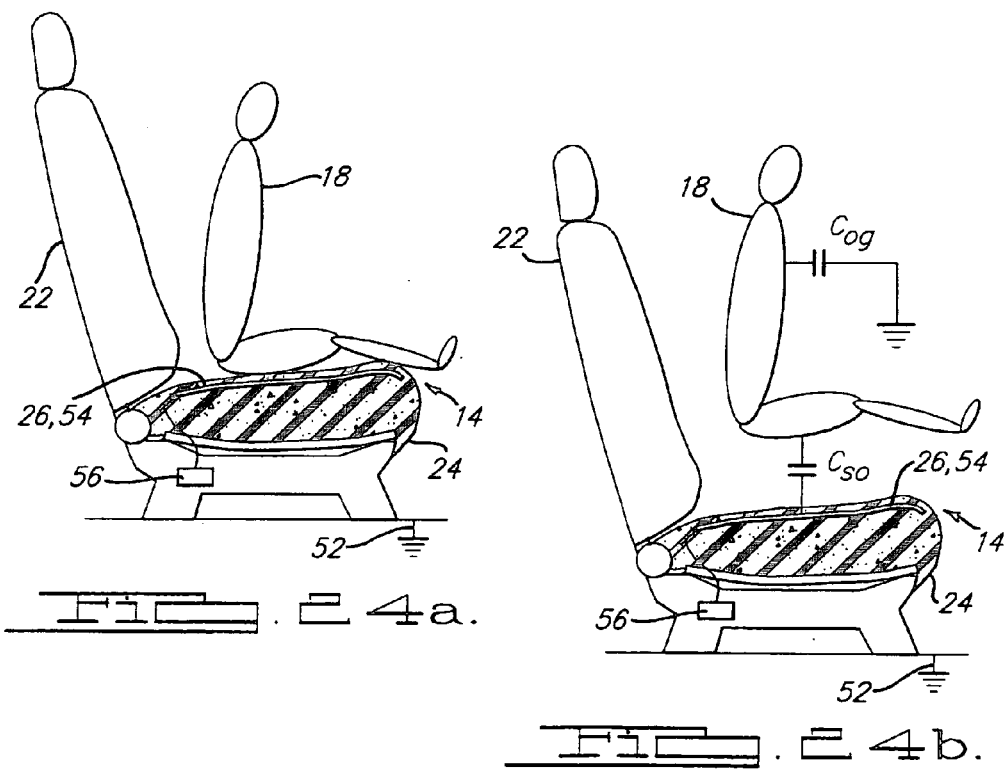
FIG. 24a.
FIG. 24b.

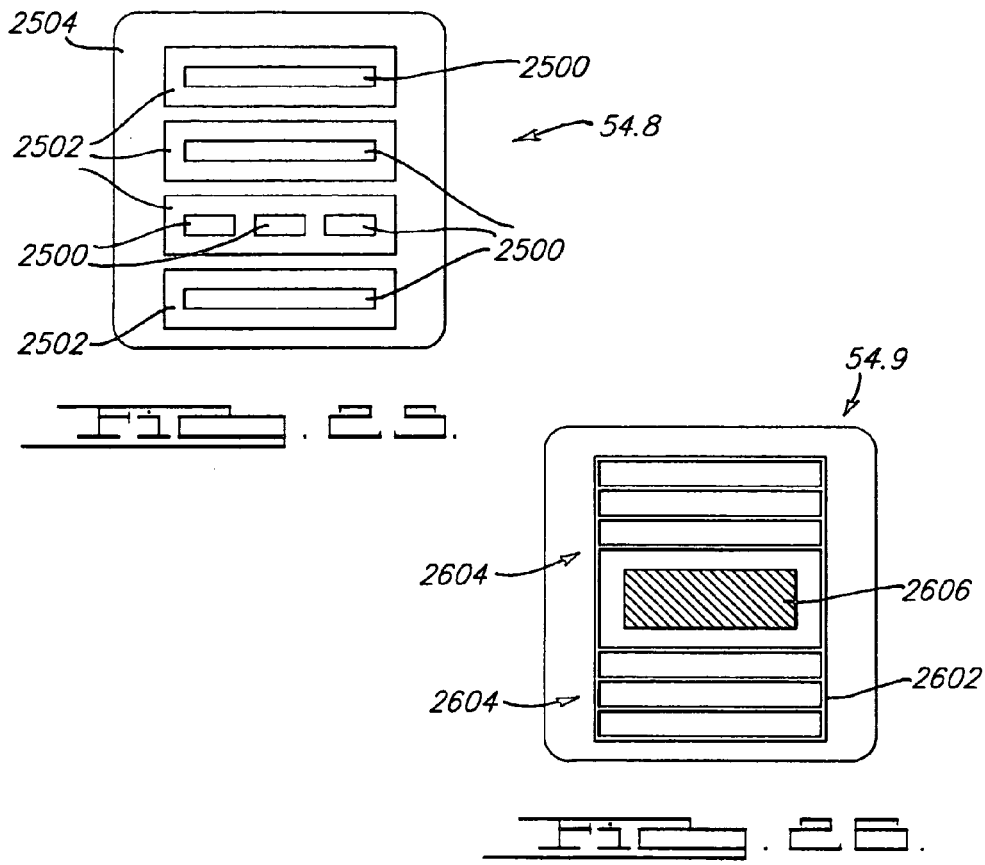
FIG. 25.
FIG. 26.
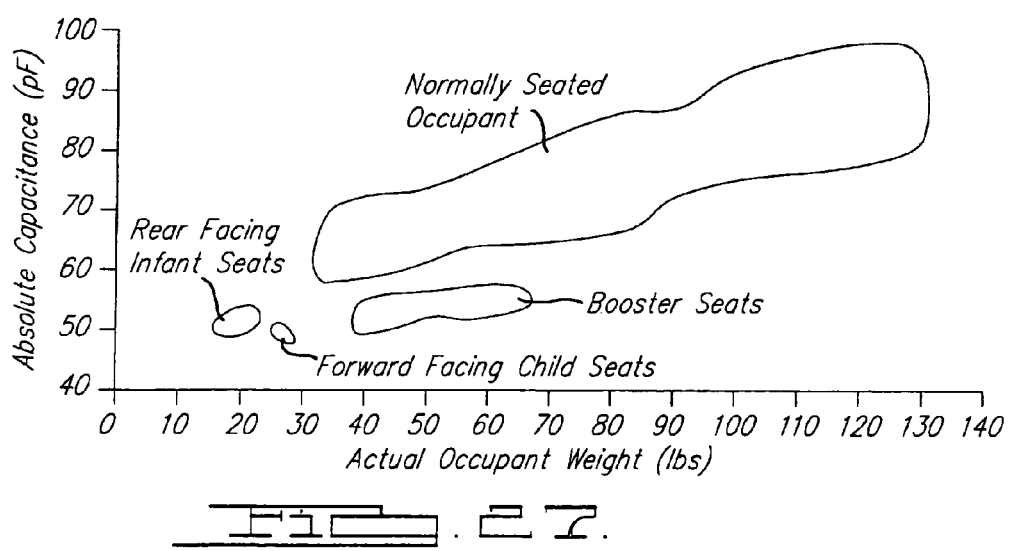
FIG. 27.

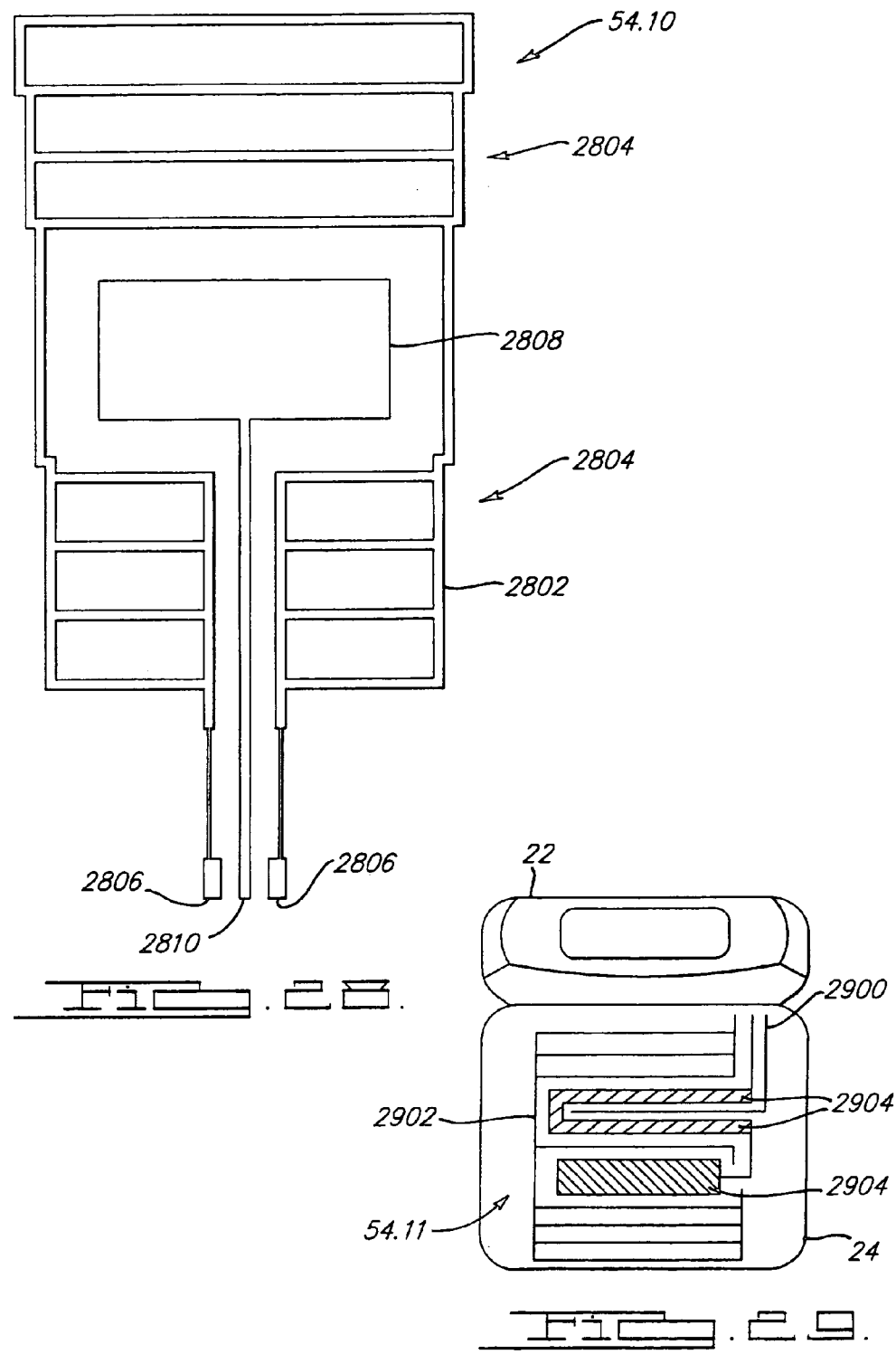

AUTOMOTIVE SYSTEMS

CROSS-REFERENCE TO RELATED APPLICATIONS

The instant application is a divisional of U.S. application Ser. No. 10/153,378 filed May 21, 2002, now U.S. Pat. No. 6,825,765, which is a continuation-in-part of U.S. application Ser. No. 09/614,086 ("Application '086") filed on Jul. 11, 2000, now U.S. Pat. No. 6,392,542, which claims the benefit of U.S. Provisional Application No. 60/143,761 filed on Jul. 13, 1999; U.S. Provisional Application Ser. No. 60/144,161 filed on Jul. 15, 1999; and U.S. Provisional Application Ser. No. 60/207,536 filed on May 26, 2000. Application '086 is a continuation-in-part of U.S. application Ser. No. 09/474,600 filed on Dec. 29, 1999, now U.S. Pat. No. 6,520,535; and a continuation-in-part of U.S. application Ser. No. 09/474,673, filed on Dec. 29, 1999, now U.S. Pat. No. 6,283,504.

Application Ser. No. 10/153,378 is also a continuation-in-part of U.S. application Ser. No. 09/474,470 filed on Dec. 29, 1999, now U.S. Pat. No. 6,577,023, which claims the benefit of U.S. Provisional Application Ser. No. 60/114,269 filed on Dec. 30, 1998; U.S. Provisional Application No. 60/133,630 filed on May 11, 1999; U.S. Provisional Application Ser. No. 60/133,632 filed on May 11, 1999; and U.S. Provisional Application Ser. No. 60/143,761 filed on Jul. 12, 1999.

Application Ser. No. 10/153,378 is also a continuation-in-part of U.S. application Ser. No. 09/474,469 filed on Dec. 29, 1999, now U.S. Pat. No. 6,563,231, which claims the benefit of U.S. Provisional Application Ser. No. 60/114,269 filed on Dec. 30, 1998; U.S. Provisional Application Ser. No. 60/133,630 filed on May 11, 1999; U.S. Provisional Application Ser. No. 60/133,632 filed on May 11, 1999; and U.S. Provisional Application Ser. No. 60/143,761 filed on Jul. 12, 1999.

The instant application is also related to U.S. application Ser. No. 09/520,866 filed on Mar. 6, 2000, now U.S. Pat. No. 6,348,862.

The above-identified patents and patent applications are incorporated herein by reference.

BRIEF DESCRIPTION OF THE DRAWINGS

In the accompanying drawings:

FIG. 8 illustrates an embodiment of a circuit for sensing capacitance and for controlling a restraint actuator responsive to capacitance measurements and responsive to a measure of seat weight;

FIG. 9 illustrates the operation of various switch elements of the sensing circuit of FIG. 8;

FIG. 11 illustrates another embodiment of a circuit for sensing capacitance and for controlling a restraint actuator responsive to capacitance measurements and responsive to a measure of seat weight;

FIG. 18a illustrates a cross-section of the embodiment illustrated in FIG. 17a;

FIG. 19 illustrates a front driven shield in a shielding mode in accordance with a second aspect of the instant invention;

FIG. 20 illustrates a front driven shield in a sensing mode in accordance with a first embodiment of a second aspect of the instant invention;

FIG. 21 illustrates a front driven shield in a sensing mode in accordance with a second embodiment of a second aspect of the instant invention;

FIG. 22 illustrates a third method of detecting a child seat on a vehicle seat;

FIG. 23 illustrates a fourth method of detecting a child seat on a vehicle seat;

FIGS. 24a and 24b illustrates the capacitance of the occupant relative to an electric field sensor and relative to a circuit ground;

FIG. 25 illustrates an embodiment of a second aspect of a capacitive sensing pad;

FIG. 26 illustrates another embodiment of a second aspect of a capacitive sensing pad;

FIG. 27 illustrates the performance of the instant invention incorporating a capacitive sensing pad in accordance with the embodiment illustrated in FIG. 26;

FIG. 28 illustrates yet another embodiment of a second aspect of a capacitive sensing pad; and FIG. 29 illustrates a third aspect of a capacitive sensing pad.

DESCRIPTION OF EMBODIMENT(S)

Figure 1:
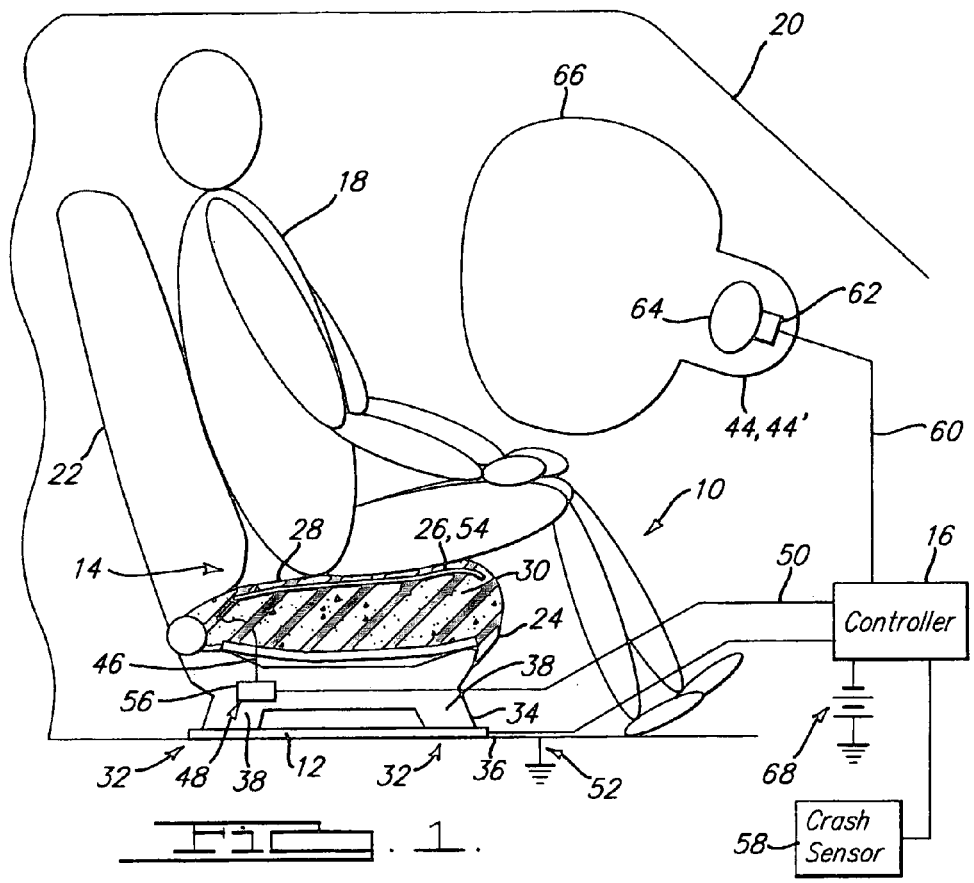
FIG. 1 illustrates an occupant detection system incorporating a first embodiment of a seat weight sensor.

Referring to FIG. 1, an occupant detection system 10 comprises a seat weight sensor 12 and an electric field sensor 14, each operatively connected to a controller 16, for detecting an occupant 18 in a vehicle 20. The seat weight sensor 12 is adapted to generate a measure of weight upon the a vehicle seat 22, e.g. upon the associated seat bottom 24. The electric field sensor 14 comprises at least one electrode 26 located, for example, in the seat bottom 24 under the seat cover 28 and close to the top of a foam cushion 30, and adapted to enable a type of occupant 18 or object that may be upon the seat bottom 24 of the vehicle seat 22 to be distinguished.

The seat weight sensor 12 is responsive to a force upon onto the vehicle seat 22. The seat weight sensor 12, for example, may comprise one or more load cells 32 operatively coupled to at least one load path between the seat bottom 24 and the vehicle 20, e.g. between the seat frame 34 and the floor pan 36 of the vehicle 20, e.g. at the corners 38 of the seat frame 34, so as to measure the weight of the entire vehicle seat 22 and objects or occupants 18 placed thereon. For example, the one or more load cells 32 could use a strain gage, a magnetostrictive sensing element, a force sensitive resistive element, or another type of sensing element to measure the associated load. For example, the seat weight sensor 12 may be constructed in accordance with the teachings of U.S. Pat. Nos. 5,905,210, 6,069,325 or 6,323,444, each of which is incorporated herein by reference.

Figure 2:
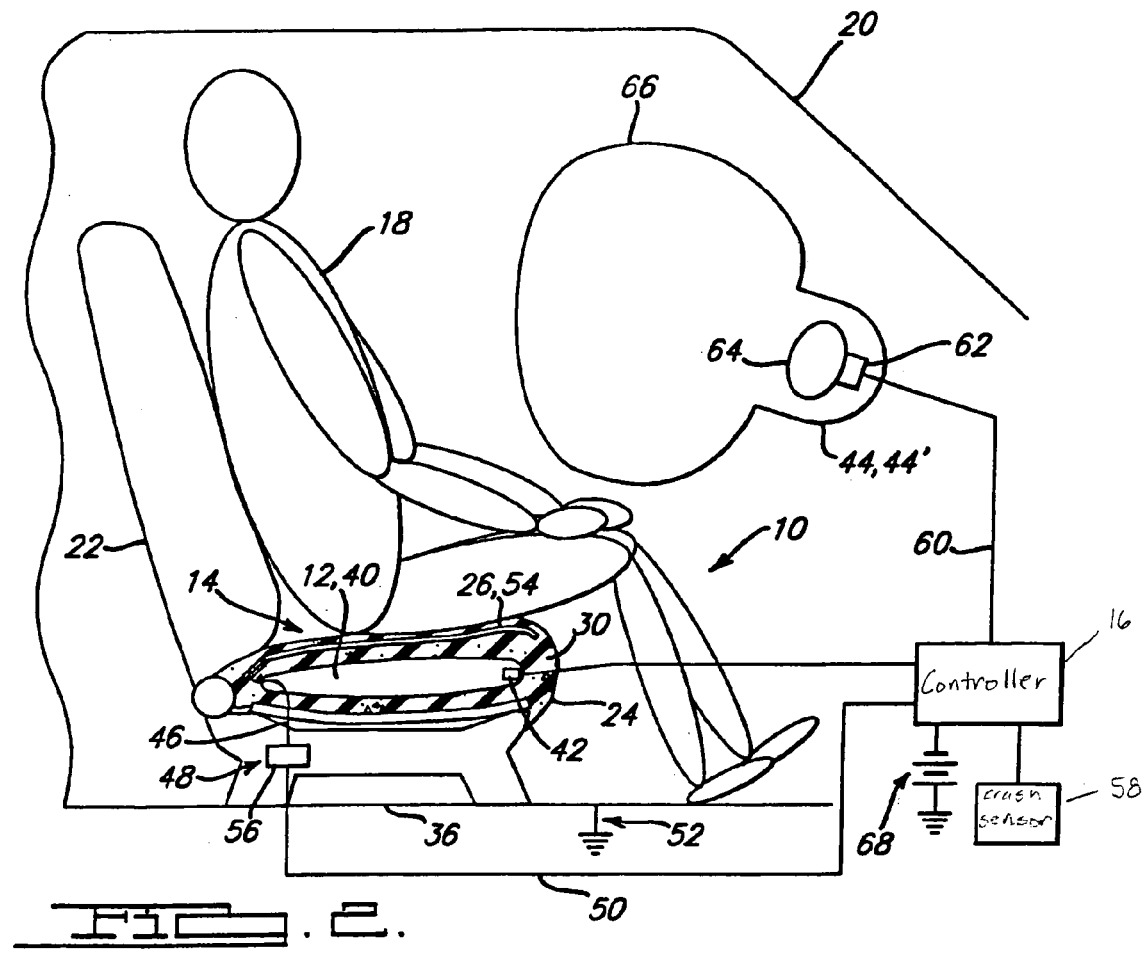
FIG. 2 illustrates an occupant detection system incorporating a second embodiment of a seat weight sensor.

The seat weight sensor 12 may alternately comprise at least one weight sensing element, e.g. a force sensitive resistive element, a membrane switch element, a pressure sensitive resistive contact, a pressure pattern sensor, a strain gage, a bend sensor, or a hydrostatic weight sensing element, operatively coupled to one or more seating surfaces in the seat base or seat back, e.g. in accordance with the teachings of U.S. Pat. Nos. 5,918,696, 5,927,427, 5,957,491, 5,979,585, 5,984,349, 5,986,221, 6,021,863, 6,045,155, 6,076,853, 6,109,117 or 6,056,079, each of which is incorporated herein by reference. For example, referring to FIG. 2, the seat weight sensor 12 may comprise a hydrostatic weight sensing element—e.g. a fluid containing bladder 40, underneath the seat cover 28 of the seat bottom 24 and supported by the seat frame 34—wherein a pressure sensor 42 operatively connected to the bladder 40 measures the pressure of the fluid contained therein so as to provide a measure of occupant weight. The pressure sensor 42 is operatively connected to the controller 16 so as to provide a pressure signal thereto, which determines a measure of weight therefrom. A seat weight sensor 12 within the cushion 30 of the vehicle seat 22, e.g. in the seat bottom 24 only, would typically not be as accurate as a seat weight sensor 12 that measures the weight of the entire vehicle seat 22, but would still provide information about the weight of an occupant on the vehicle seat 22 sufficient for the occupant detection system 10 to control a restraint actuator 44, e.g. an air bag inflator module 44', responsive thereto. The particular type of seat weight sensor 12 is not considered to be limiting. The seat weight sensor 12 may, for example, be integrated with either the seat frame 34 or the seat bottom 24.

As used herein, the term "electric field sensor" refers to a sensor that generates a signal responsive to the influence of that being sensed, upon an electric field. Generally, an electric field sensor comprises at least one electrode to which is applied at least one applied signal; and at least one electrode—which could be the same electrode or electrodes to which the applied signal is applied—at which a received signal (or response) is measured. The applied signal generates an electric field from the at least one electrode to a ground in the environment of the at least one electrode, or to another at least one electrode. The applied and received signals can be associated with the same electrode or electrodes, or with different electrodes. The particular electric field associated with a given electrode or set of electrodes is dependent upon the nature and geometry of the electrode or set of electrodes and upon the nature of the surroundings thereto, for example, the dielectric properties of the surroundings. For a fixed electrode geometry, the received signal or signals of an electric field sensor are responsive to the applied signal or signals and to the nature of the environment influencing the resulting electric field, for example to the presence and location of an object having a permittivity or conductivity different from that of its surroundings.

One form of electric field sensor is a capacitive sensor, wherein the capacitance of one or more electrodes is measured—from the relationship between received and applied signals—for a given electrode configuration. The technical paper "Field mice: Extracting hand geometry from electric field measurements" by J. R. Smith, published in IBM Systems Journal, Vol. 35, Nos. 3 & 4, 1996, pp. 587–608, incorporated herein by reference, describes the concept of electric field sensing as used for making non-contact three-dimensional position measurements, and more particularly for sensing the position of a human hand for purposes of providing three dimensional positional inputs to a computer. What has commonly been referred to as capacitive sensing actually comprises the distinct mechanisms of what the author refers to as "loading mode", "shunt mode", and "transmit mode" which correspond to various possible electric current pathways. In the "shunt mode", a voltage oscillating at low frequency is applied to a transmit electrode, and the displacement current induced at a receive electrode is measured with a current amplifier, whereby the displacement current may be modified by the body being sensed. In the "loading mode", the object to be sensed modifies the capacitance of a transmit electrode relative to ground. In the "transmit mode", the transmit electrode is put in contact with the user's body, which then becomes a transmitter relative to a receiver, either by direct electrical connection or via capacitive coupling.

Accordingly, the electric field sensor 14 is either what is commonly known as a capacitive sensor, or more generally an electric field sensor operating in any of the above described modes. The electric field sensor 14 comprises at least one electrode 26 operatively coupled to at least one applied signal 46 so as to generate an electric field proximate to the at least one electrode 26, responsive to the applied signal 46. The applied signal 46, for example, comprises either an oscillating or pulsed signal. At least one electrode 26 is operatively coupled to a sensing circuit 48 that outputs at least one response signal 50 responsive to the electric field at the corresponding electrode 26, wherein the response signal 50 is responsive to at least one electric-field-influencing property—for example, dielectric constant, conductivity, size, mass or distance—of an object proximate to the electric field sensor 14. For example, for the electric field sensor 14 as a capacitance sensor, the sensing circuit 48 measures the capacitance of at least one electrode 26 with respect to either another electrode 26 or with respect to a surrounding ground, for example, a seat frame 34 of the vehicle seat 22, connected to circuit ground 52. The at least one applied signal 46 is, for example, generated by the sensing circuit 48 that also outputs the at least one response signal 50. The sensing circuit 48 and associated at least one applied signal 46 may be adapted to be responsive to the influence of a water soaked vehicle seat 22, on measurements from the electric field sensor 14.

The electric field sensor 14 generates an electric field from the applied signal 46 applied to at least one electrode 26 and senses objects proximate to the associated at least one electrode 26, for example in the seat bottom 24 of a vehicle seat 22, from the influence of the electric field on the response signal 50. The at least one electrode 26 of the electric field sensor 14, the applied signal 46 applied thereto, and the sensitivity of the sensing circuit 48 are all adapted so that the electric field sensor 14 is, for example, substantially non-responsive to objects that are more than 50 mm above the seat bottom 24, but is substantially responsive to occupants that are normally seated directly on the vehicle seat 22.

The at least one electrode 26 of the electric field sensor 14 is adapted so as to provide for distinguishing seating conditions for which a restraint actuator 44, for example an air bag inflator module 44', should be deployed from seating conditions for which the restraint actuator 44 should not be deployed, so as to avoid causing more injury to an occupant 18 than the occupant 18 would otherwise incur without the deployment of the restraint actuator 44. For example, the electrode 26 is adapted so that a capacitance of the at least one electrode 26 with respect to a circuit ground 52 is substantially greater for a seating condition for which the restraint actuator 44 should be deployed, for example an occupant 18 seated in substantially normal seating position on the vehicle seat 22 or a large body immediately above the seat bottom 24; than for a seating condition for which the restraint actuator 44 should not be deployed, for example an empty vehicle seat 22, an infant, child, or booster seat on the vehicle seat 22 with or without an infant or child seated therein, or an occupant 18 on the vehicle seat 22 in a position that is substantially different from a normal seating position. The at least one electrode 26 is, for example, located under the seat cover 28 and substantially the same size as a region to be sensed on the vehicle seat 22, extending from near the back of the seat bottom 24 to near the front of the seat bottom 24. As described hereinbelow, sections of the at least one electrode 26 are removed or selectively shielded so as to selectively reduce the sensitivity thereof proximate to regions where an infant or child, in an infant, child, or booster seat, is closest to the vehicle seat 22, so as to provide for distinguishing between a child seated in a child seat and an occupant 18 that is seated directly on the vehicle seat 22. Responsive to a child in a child seat on the vehicle seat 22, the increase in capacitance of the electrode 26 of the electric field sensor 14 in the seat bottom 24, relative to that of an empty vehicle seat 22, is relatively small.

Stated in another way, the electric field sensor 14 has a relatively short range and principally senses an occupant 18 when a large surface of the occupant is relatively close to the sensor. Occupants normally seated directly on the seat cover 28 typically have a large surface of their body relatively close to the electrode 26. When infants or children are in child seats, most of their body is elevated several inches off the seat bottom surface, resulting in a relatively small influence upon the electric field sensor 14. The electric field sensor 14 in the seat bottom 24 distinguishes between a large body immediately above the seat cover 28—for example a normally seated, forward facing occupant in the seat—and an infant or child seat—including rear facing, front facing and booster seats—located on a vehicle seat 22. When the vehicle seat 22 contains a child seat (including a rear facing infant seats, a forward facing child seat and a booster seats), or when the vehicle seat 22 is empty, no forward facing occupant is detected near to the seat bottom and, as a result, the electric field sensor 14 causes the restraint actuator 44 to be disabled.

An electrode 26 of the electric field sensor 14 may be constructed in a variety of ways, and the method of construction is not considered limiting. For example, an electrode 26 may be constructed using rigid circuit board or a flexible circuit using known printed circuit board techniques such as etching or deposition of conductive materials applied to a dielectric substrate. Alternately, an electrode 26 may comprise a discrete conductor, such as a conductive film, sheet or mesh that is distinct from or an integral part of the vehicle seat 22 or components thereof. The assembly of one or more electrodes 26 together with the associated substrate is sometimes referred to as a sensing pad or a capacitive sensing pad 54.

In an exemplary embodiment, the electric field sensor 14 comprises a capacitive sensing pad 54 connected to an electronics module 56 containing the sensing circuit 48 necessary to measure the capacitance of the capacitive sensing pad 54 relative to the circuit ground 52, or another measurement, responsive to the influence of an electric-field-influencing medium upon the electric field sensor 14. In operation, an occupant 18 seated on the seat bottom 24 of vehicle seat 22 sufficiently increases the capacitance of the electric field sensor 14 so as to indicate the presence of the occupant. The capacitive sensing pad 54 is adapted so as to provide a different response to large objects, such as normally seated adults, on the seat bottom 24—for which an air bag restraint system would be beneficial in a crash,—than to objects such as rear facing infant seats, child seats, and booster seats on the vehicle seat—for which an air bag restraint system would not be beneficial in a crash.

The seat weight sensor 12, electric field sensor 14 and a crash sensor 58 are operatively coupled to the controller 16, which operates in accordance with known analog, digital, or microprocessor circuitry and software, and in accordance with one or more processes described hereinbelow, to control the actuation of the restraint actuator 44 responsive to signals from the seat weight sensor 12 and the electric field sensor 14 indicative of a seat occupancy scenario; and responsive to a signal from the crash sensor 58, indicative of a crash. For the example of a restraint actuator 44 comprising an air bag inflator module 44', responsive to a crash detected by the crash sensor 58, if the occupant detection system 10 has enabled actuation of the restraint actuator 44, then the controller 16 generates a signal 60 which is operatively coupled to one or more initiators 62 of one or more gas generators 64 mounted in an air bag inflator module 44', thereby controlling the activation of the air bag inflator module 44' so as to inflate the air bag 66 as necessary to protect the occupant 18 from injury which might otherwise be caused by the crash. The electrical power necessary to carry out these operations is provided by a source of power 68, e.g. the vehicle battery. In another embodiment, the occupant detection system 10 may make the deployment enable/disable decision for the restraint actuator 44, and communicate this decision to the controller 16 for controlling the actuation of the restraint actuator 44. In yet another embodiment, the occupant detection system 10 may incorporate the crash sensor 58 and the elements of the controller 16 in a single module that controls the actuation of the restraint actuator 44 as described hereinabove.

Figure 3:
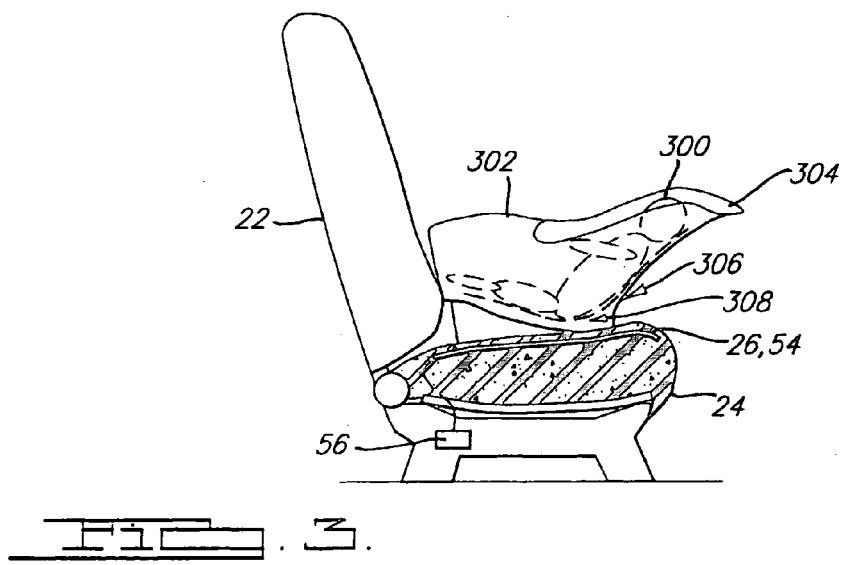
FIG. 3 illustrates a child in a typical rear facing infant seat placed on a vehicle seat.

Referring to FIG. 3, the occupant detection system 10 can be used to distinguish infants or children in rear facing infant seats, child seats or booster seats, from adults, on the basis that the child 300 therein does not have a large surface of its body very near to the seat bottom 24 and the at least one electrode 26 contained therein. For example, for the electric field sensor 14 providing a signal responsive to the capacitance of at least one electrode 26 thereof, a normally seated occupant provides a substantially larger increase in capacitance relative to an empty seat, than does a child seat 302, e.g. a rear facing infant seat 304. The occupant detection system 10 can discriminate a rear facing infant seat 304 (RFIS), or generally a child seat 302, from an adult occupant 18 because the child 300 in a rear facing infant seat 304 does not have a large surface of its body very near to the seat bottom 24 and the at least one electrode 26 contained therein. The seating contour 306 inside the rear facing infant seat 304 is such that the buttocks of the child 300 are closest to the seat bottom 24 of the vehicle seat 22. Usually there is a significant gap 308, up to several inches, between the child 300 and the seat bottom 24 of the vehicle seat 22. Since child seats are typically made of plastic, the seats themselves are not sensed directly by the electric field sensor 14. Even for a rear facing infant seat 304 for which the gap 308 between the child 300 and the seat bottom 24 of the vehicle seat 22 is relatively small, the inside seating contour 306 still creates a significant gap between the at least one electrode 26 and all parts of the child 300 except the buttocks. Since only a small portion of the surface of the child 300 is near to the at least one electrode 26, the capacitance measured by the electric field sensor 14 is relatively low, and more particularly, less than the threshold capacitance, $C_{norm}$ for detecting a normally seated occupant 18.

Figure 4A:
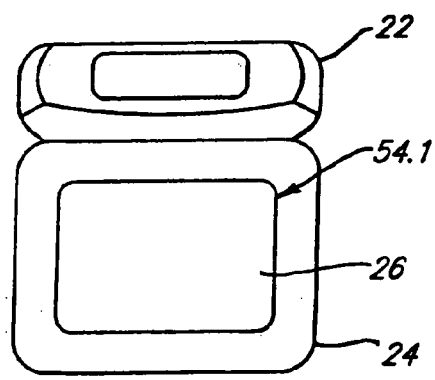
FIGS. 4a and 4b illustrate several electrode embodiments in accordance with an electric field sensor.
Figure 4B:
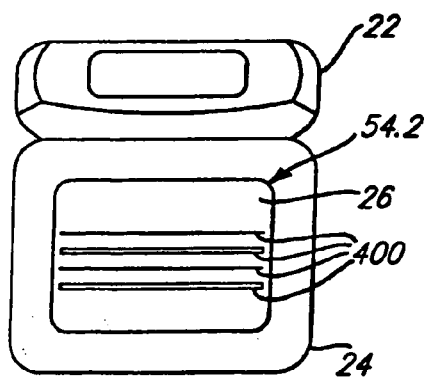
Figure 5A:
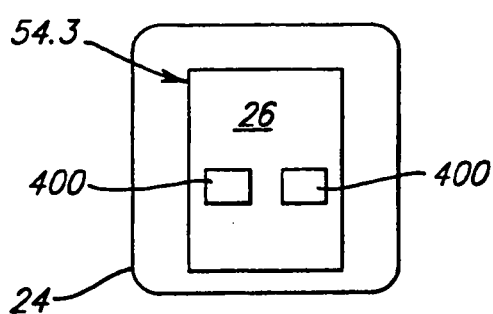
FIGS. 5a and 5b illustrate other electrode embodiments in accordance with an electric field sensor.
Figure 5B:
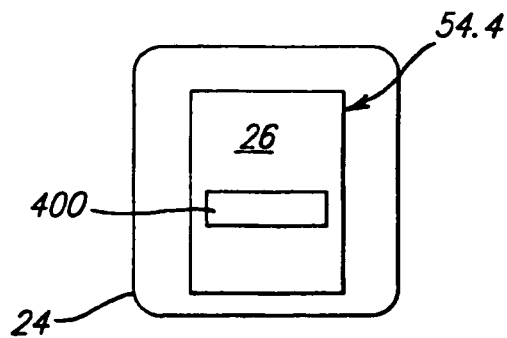

Referring to FIGS. 4a and 4b, the sensitivity to a rear facing infant seat 304 of an elementary capacitive sensing pad 54.1, shown in FIG. 4a, comprising a continuous conductive sheet electrode 26, can be reduced by the modification shown in FIG. 4b, particularly for a rear facing infant seat 304 that exhibits a relatively small gap 308 between the capacitive sensing pad 54.1 and the child 300. Referring to FIG. 4b, the portion of the child seat 302 where the gap 308 is small, when the child seat 302 is properly installed, is usually within a zone between 9 and 12 inches from the seat back and across the entire seat bottom 24. The capacitive sensing pad 54.2 is adapted to make this zone less sensitive than the remaining portion of the capacitive sensing pad 54.1 by removing at least one region 400 of the at least one electrode 26 within the area of greatest sensitivity. Accordingly, this increases the differentiation between a worst case signal for a rear facing infant seat 304 and the signal for a normally seated adult. Whereas, for example, rectangular slots are illustrated in FIG. 4b, one of ordinary skill in the art will recognize that the modification to the capacitive sensing pad 54.2 within the zone can be accomplished with a variety of geometries so as provide for a similar effect on the sensitivity pattern of the capacitive sensing pad 54.2. For example FIGS. 5a and 5b illustrates at least one region 400 within which the conductor is removed from the at least one electrode 26 so as to reduce the sensitivity thereof to an object proximate to the respective at least one region 400. In FIG. 5a, the capacitive sensing pad 54.3 comprises two regions 400 within which the conductor is removed, and in FIG. 5b, the capacitive sensing pad 54.4 comprises one region 400 within which the conductor is removed.

The temperature range that is possible in an automotive environment can potentially adversely affect the sensing circuit 48 associated with the electric field sensor 14, causing a drift in the "perceived" sensor reading. One way to combat this drift is to use a reference capacitor that can be switched into the measurement circuit in place of the sensing electrode. Because the reference capacitor can be selected such that its value is relatively stable over temperature, drift can be identified and this information can be used to alter a decision threshold. An alternative scheme is to always measure the difference between a reference capacitor and the sensor capacitance. A second "calibration" capacitor can then be switched in to take the place of the sensor to identify the measurement system gain. Using a reference capacitor and a calibration capacitor allows the system to continuously compensate for variations in the measurement circuit. Rather than attempting to measure the temperature and then make a correction, the reference and calibration capacitor are used to measure the current offset and gain of the measurement circuitry so that measurements are always consistent. Switching between the reference capacitor, the calibration capacitor, or a sensor can be done using a combination of FET's or an analog demultiplexer such as a CD4051 from Texas Instruments.

Figure 6A:
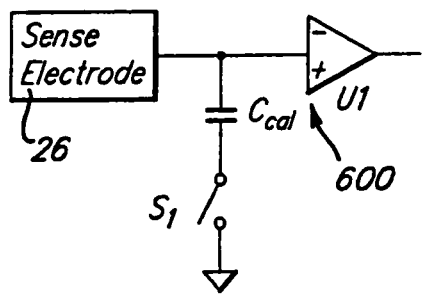
FIG. 6a illustrates a first embodiment of a circuit for switching a calibration capacitor.
Figure 6B:
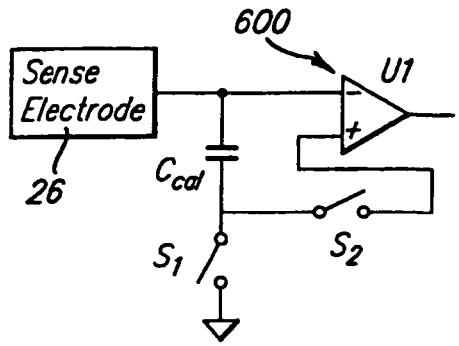
FIG. 6b illustrates a second embodiment of a circuit for switching a calibration capacitor.

Referring to FIGS. 6a and 6b, the sensing circuit 48 is provided with a switchable calibration capacitor $C_{cal}$ that enables an associated gain factor to be measured over time during the operation of the electric field sensor 14, so as to provide for drift compensation.

Accurately switching in and out a relatively small (e.g. 1 picofarad or less) calibration capacitance can be difficult. One side of the calibration capacitor $C_{cal}$ is operatively connected to the at least one electrode 26 and to the inverting input of an amplifier 600 ($U_1$). As illustrated in FIG. 6a, the other side of the calibration capacitor $C_{cal}$ is switched to ground by a first switch $S_1$, so that when first switch $S_1$ is closed, the capacitance of calibration capacitor $C_{cal}$ is added to that of the electrode 26. However, one problem with this arrangement of FIG. 6a with only a first switch $S_1$ is that when the first switch $S_1$ is opened, the capacitance of the first switch $S_1$ is typically larger than the capacitance $C_{cal}$ of the calibration capacitor $C_{cal}$, thereby defeating the purpose of the calibration capacitor $C_{cal}$. For example, a typical FET may have an OFF capacitance of 40 picofarads, so if the capacitance $C_{cal}$ is 1 picofarad, then the series combination is 0.98 picofarad, which means that effectively the calibration capacitor $C_{cal}$ is never switched out of the circuit.

This problem is overcome by the arrangement of FIG. 6b, wherein the other side of the calibration capacitor $C_{cal}$ is switched to the non-inverting input of the amplifier 600 ($U_1$) by a second switch $S_2$. When the first switch $S_1$ is closed and the second switch $S_2$ is open, one side of the calibration capacitor $C_{cal}$ is pulled to ground, thereby switching the calibration capacitor $C_{cal}$ into the circuit. When the first switch $S_1$ is opened and the second switch $S_2$ is closed, both sides of the calibration capacitor $C_{cal}$ are driven by the same signal, preventing any current from flowing through the calibration capacitor $C_{cal}$, thereby effectively switching the calibration capacitor $C_{cal}$ out of the circuit.

Figure 7:
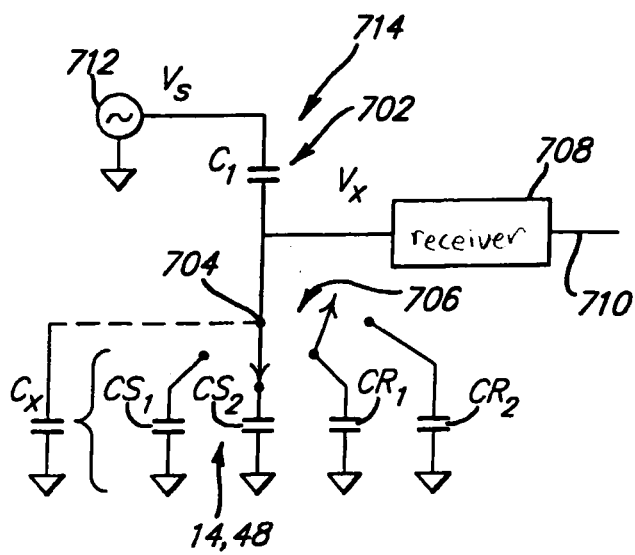
FIG. 7 illustrates a generalized sensing circuit for measuring a capacitance.

Referring to FIG. 7, one technique for measuring a capacitance $C_X$ is to measure the voltage from a capacitive voltage divider 702 comprising a known capacitance $C_1$ in series $$V_X = V_s \cdot \left( \frac{C_1}{C_1 + C_X} \right)$$

with the capacitance $C_X$ to be measured, wherein an oscillating voltage source $V_S$ is applied across the capacitive voltage divider 702 and a voltage $V_X$ responsive to the capacitance $C_X$ is measured at the junction 704 of the capacitive voltage divider 702 between the known capacitance $C_1$ and the capacitance $C_X$ to be measured. For both the known capacitance $C_1$ and the capacitance $C_X$ to be measured represented as pure capacitances for purposes of illustration, the voltage $V_X$ is given by:

Accordingly, if both $C_1$ and $V_S$ are known, then $C_X$ can be determined from $V_X$. However, as described above, $V_S$, $C_1$ or the associated circuitry may subject to drift over time $$CS_1 = CR_1 + CR_2 \cdot \left( \frac{1 - \frac{VR_1}{VS_1}}{1 - \frac{VR_1}{VR_{12}}} \right)$$

or as a result of environmental conditions, or subject to system-to-system variation. The affect of this drift or variation is compensated by repetitively switching the capacitance $C_X$ to be measured from the unknown capacitance of an electric field sensor to the known capacitance of one or more temperature stable reference capacitors, wherein the repetitive switching process is cycled sufficiently quickly so that that drift or variation over the measurement cycle is negligible. For example, as illustrated in FIG. 7, one or more various capacitances are switched into the capacitive voltage divider 702 as capacitance $C_X$ by a switching element 706. For example, as a first step, the switching element 706 connects the at least one electrode 26 of the electric field sensor 14 having a capacitance $CS_1$ to the junction 704 of the capacitive voltage divider 702 as capacitance $C_X$ and a corresponding voltage $VS_1$ is measured as $V_X$. Then as a second step, the switching element 706 connects a first reference capacitor $CR_1$ to the junction 704 of the capacitive voltage divider 702 as capacitance $C_X$ and a corresponding voltage $VR_1$ is measured as $V_X$. Then as a third step, the switching element 706 adds a second reference capacitor $CR_2$ to the junction 704 of the capacitive voltage divider 702 so that the capacitance Cx is given by the sum $(CR_1+CR_2)$, and a corresponding voltage $VR_{12}$ is measured as $V_X$. The period of time between the first and third steps is sufficiently short for there to be negligible drift in the measurement of $V_X$ over that period of time. The three voltage measurements can then be used to provide a measure of the capacitance $CS_1$ of the at least one electrode 26 of the electric field sensor 14—independent of $V_S$ or $C_1$—as follows:

The capacitance of at least one second electrode 26.2 of the electric field sensor 14 containing first 26.1 and second 26.2 electrodes, is measured by repeating the above three step process, except for switching the at least one second electrode 26.2 instead of the at least one first electrode 26.1 during the first step.

Accordingly the electric field sensor 14 comprises at least one electrode 26 operatively coupled to an applied signal Vs thorough a capacitive voltage divider 702 so as to generate an electric field proximate to the at least one electrode 26 responsive to a voltage $V_X$ on the at least one electrode 26. The applied signal $V_S$, for example, comprises an oscillating signal. The at least one electrode 26 is operatively coupled to a receiver 708 which outputs a response signal 710 responsive to the electric field at the corresponding at least one electrode 26, wherein the response signal 710 is responsive to at least one electric-field-influencing property—for example dielectric constant, conductivity, size, mass or distance—of an object proximate to the electric field sensor 14. For example, for the electric field sensor 14 as a capacitance sensor, the receiver 708 provides a measure of the capacitance of at least one electrode 26 with respect to a surrounding ground. The applied signal $V_S$ is, for example, generated by an oscillator 712 incorporated in a sensing circuit 714 that also incorporates the receiver 708.

The sensor measurements can be made by a single sensing circuit 714 that incorporates a switching element 706 to operatively couple either the at least one electrode 26, the at least one first electrode 26.1, or the at least one second electrode 26.2 to a common oscillator 712 and receiver 708 for generating the respective measures of capacitance $CS_1$, $CS_2$.

The capacitance of the at least one electrode 26, the at least one first electrode 26.1, or the at least one second electrode 26.2 relative to ground is relatively small, for example less than about 300 picofarads. The temperature range that is possible in an automotive environment can significantly affect the components of the sensing circuit 714, causing drift that could be erroneously interpreted as a measurement that could cause the restraint actuator 44 to be erroneously enabled by the controller 16. The effects of this drift can be mitigated by incorporating a temperature stable reference capacitor in the sensing circuit 714 that is switched in place of either the at least one first electrode 26.1 or the at least one second electrode 26.2 so as to provide a means for making comparative capacitive measurements.

Referring to FIG. 8, illustrating an exemplary sensing circuit 714, an oscillator 802 generates an oscillating signal, for example a sinusoidal signal, that is filtered by a first bandpass filter 804 so as to create a first oscillating signal 806. The first oscillating signal 806 is applied to a capacitive voltage divider 808 comprising capacitor $C_1$, resistors $R_1$ and $R_2$, and one or more capacitive elements to be measured, selected from at least one electrode 26, at least one first electrode 26.1, at least one second electrode 26.2, a first reference capacitor $C_{R1}$, and a second reference capacitor $C_{R2}$, wherein the capacitive elements to be measured are included or excluded responsive to the states of respective FET switches $Q_{1a}$, $Q_{1b}$, $Q_{2a}$, $Q_{2b}$, $Q_{3a}$, $Q_{3b}$, $Q_{4a}$ and $Q_{4b}$. Capacitor $C_1$, resistors $R_1$ and $R_2$, and the FET switches $Q_{1a}$, $Q_{2a}$, $Q_{3a}$ and $Q_{4a}$—that when active switch in the respective capacitive elements to be measured,—are all connected to one another at a first node 810, which is connected to the input 812 of a voltage follower $U_1$. The output 814 of the voltage follower $U_1$ is connected to FET switches $Q_{1b}$, $Q_{2b}$, $Q_{3b}$ and $Q_{4b}$ that when active, switch out the respective capacitive elements so as to not be measured. The activation of the FET switch elements of FET switch pairs $Q_{1a}$ and $Q_{1b}$, $Q_{2a}$ and $Q_{2b}$, $Q_{3a}$ and $Q_{3b}$ and $Q_{4a}$ and $Q_{4b}$ are respectively mutually exclusive. For example if FET switch $Q_{1a}$ is activated or closed, then FET switch $Q_{1b}$ is deactivated or open. A capacitive element being measured adds to the capacitance at the first node, thereby affecting the strength of the signal at the input 812 to the voltage follower $U_1$. A capacitive element, not being measured is disconnected from the first node by its respective first FET switch element, and connected to the output 814 of the voltage follower $U_1$ by its respective second FET switch element, wherein, in accordance with the characteristics of the associated operational amplifier of the voltage follower $U_1$, the output 814 of the voltage follower $U_1$ follows the signal of the first node without that respective capacitive element connected, and voltage follower $U_1$ provides a current through the associated capacitive element through the second respective FET switch element. Moreover, when the respective second FET switch element is activated, the source and drain of the respective first FET switch element are separately coupled to the respective operational amplifier inputs, so that to each is applied the same potential, thereby eliminating the affect of the capacitance of the respective first FET switch on the capacitance measurement.

The output 814 of the voltage follower $U_1$ is then coupled to a second bandpass filter 816 of the same pass band as the first bandpass filter 804, the output of which is detected by a detector 818 comprising diode $D_1$, resistor $R_3$ and capacitor $C_2$, and filtered by a first low pass filter 820. The output 822 of the first low pass filter 820 has a DC component corresponding to the capacitance at the first node 810. This DC component is filtered by a blocking capacitor $C_3$, and the resulting signal is filtered by a second low pass filter 824 to provide the amplitude 826 of the oscillating signal at the first node 810, which is related to the total capacitance at that location. The blocking capacitor $C_3$ is adapted so as to provide for a transitory measurement of the amplitude 826.

In operation, a microprocessor $U_2$ controls the activation of FET switches $Q_{1a}$, $Q_{1b}$, $Q_{2a}$, $Q_{2b}$, $Q_{3a}$, $Q_{3b}$, $Q_{4a}$ and $Q_{4b}$, for example in accordance with the control logic illustrated in FIG. 9. With the first reference capacitor $C_{R1}$ switched in by microprocessor $U_2$, i.e. with $Q_{2a}$ activated and $Q_{2b}$ deactivated, the controller measures a first amplitude. Then with the second reference capacitor $C_{R2}$ also switched in by microprocessor $U_2$, a second amplitude is measured corresponding to an incremental increase of capacitance at the first node by the capacitance of capacitor $C_{R2}$. Then a sensitivity factor is computed in Volts/picofarad given the known values of capacitance of capacitors $C_{R1}$ and $C_{R2}$ as described hereinabove with reference to FIG. 7. Then, the microprocessor $U_2$ switches out the first $C_{R1}$ and second reference capacitor $C_{R2}$, switches in the capacitve sensing pad 102, measures a third amplitude, and calculates the capacitance of either the at least one electrode 26 or the at least one second electrode 26.2—depending upon which is being measured—using the calculated sensitivity factor.

A control circuit 828 uses the measures of capacitance from the electric field sensor 14 and the measure of weight W from the seat weight sensor 12—in accordance with the steps described hereinbelow—to control whether or not the restraint actuator 44 is enabled responsive to a crash detected by a crash sensor 58. Whereas FIG. 8 illustrates the microprocessor $U_2$ and control circuit 828 as separate elements, alternate arrangements are possible. For example, both may be combined in one controller, or the microprocessor may be adapted to sense the amplitude measurements, calculate the capacitance of the first 12 and second 14 electric field sensors, and then output these capacitance values to the control circuit 828.

The at least one electrode 26 and the at least one second electrode 26.2 may be each modeled as a first capacitance $C_{S1}$ in parallel with a series combination of a second capacitance $C_{S2}$ and a resistance $R_S$, wherein the resistance $R_S$ is inversely related to the wetness of the seat. The capacitance of the capacitive sensor is dominated by $C_{S1}$ for a dry seat, but becomes affected by $C_{S2}$ and $R_S$ as the wetness of the seat increases.

The values of capacitance for capacitors $C_1$, $C_{R1}$, and $C_{R2}$ may be adapted to maximize the dynamic range of the capacitance measurement over the range of expected capacitances of the first 12 and second 14 electric field sensors.

Figure 10:
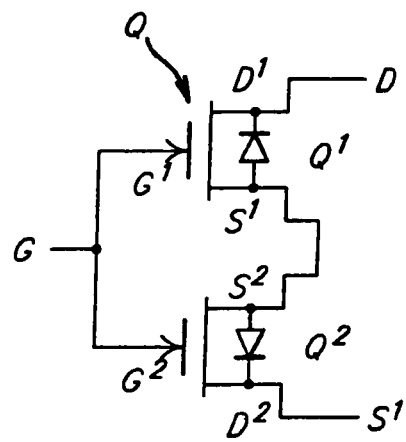
FIG. 10 illustrates an alternate FET switch embodiment.

Referring to FIG. 10, each FET switch $Q_{1a}$, $Q_{1b}$, $Q_{2a}$, $Q_{2b}$, $Q_{3a}$, $Q_{3b}$, $Q_{4a}$ or $Q_{4b}$ may be replaced by a pair of FET switches $Q^1$ and $Q^2$. Designating the terminals of the original FET switch Q as G, S and D for the gate, source and drain respectively, these terminals are mapped to the terminals of the pair of FET switches $Q^1$ and $Q^2$ as follows: 1) the respective gates $G^1$ and $G^2$ are connected together and are mapped to G; 2) the sources $S^1$ and $S^2$ are connected together; 3) the drain $D^1$ of FET switch $Q^1$ is mapped to D; and 4) the drain $D^2$ of FET switch $Q_2$ is mapped to S. This arrangement is beneficial for three-pin FET switches for which the source is connected to the body, thereby effectively creating a diode junction between the source and drain, as is illustrated in FIG. 10. With the sources $S^1$, $S^2$ interconnected, these effective diode junctions are placed back-to-back in series with opposing polarities, so as to prevent the passage of a signal without being under control of the respective gates $G^1$, $G^2$. Furthermore, the drain-source capacitance of the pair of FET switches $Q^1$ and $Q^2$ is half that of one FET switch $Q^1$, because the respective capacitances are connected in series.

FIG. 11 illustrates several other embodiments for various aspects of the sensing circuit 714.

For example, the elements to be sensed at the first node 810 may be coupled via an analog demultiplexer 1102, such as a CD4051 from Texas Instruments, wherein under control of the microprocessor $U_2$, the elements to be sensed are coupled, one element at a time, to the first node 810 by the analog demultiplexer 1102. For example, first $C_{R1a}$ and second $C_{R2a}$ reference capacitors and a capacitive sensor are each operatively connected to distinct analog inputs of the analog demultiplexer 1102, and are operatively connected—mutually exclusively—to the first node 810 by the analog demultiplexer 1102. Accordingly, with this arrangement, the calibration process differs from that illustrated in FIGS. 10a–b for which two reference capacitors can be simultaneously operatively connected to the first node 810. A plurality of analog demultiplexers 1102 may be used if more analog channels are required, in which case a separate set of reference capacitors, for example $C_{R1b}$ and $C_{R2b}$, may be used with each separate analog demultiplexer 1102 to compensate for variations amongst the various analog demultiplexers 1102.

As another example of another embodiment, an inductor L1 may be placed between the sensing node 810 and the elements to be sensed in order to reduce the effects of electromagnetic interference.

As yet another example of another embodiment, a D/A converter 1104 under control of the microprocessor $U_2$ may be used to cancel offsets in the associated amplitude signal, wherein the output from the D/A converter 1104 is operatively connected to an inverting amplifier 1106, and is subtracted from the filtered detected amplitude signal 1108. By canceling the offset in the amplitude signal, the associated circuit gain can be increased so as to increase the dynamic range of the amplitude signal.

As yet another example of another embodiment, a super diode detection circuit 1110 may be used for detecting the signal amplitude.

Figure 12:
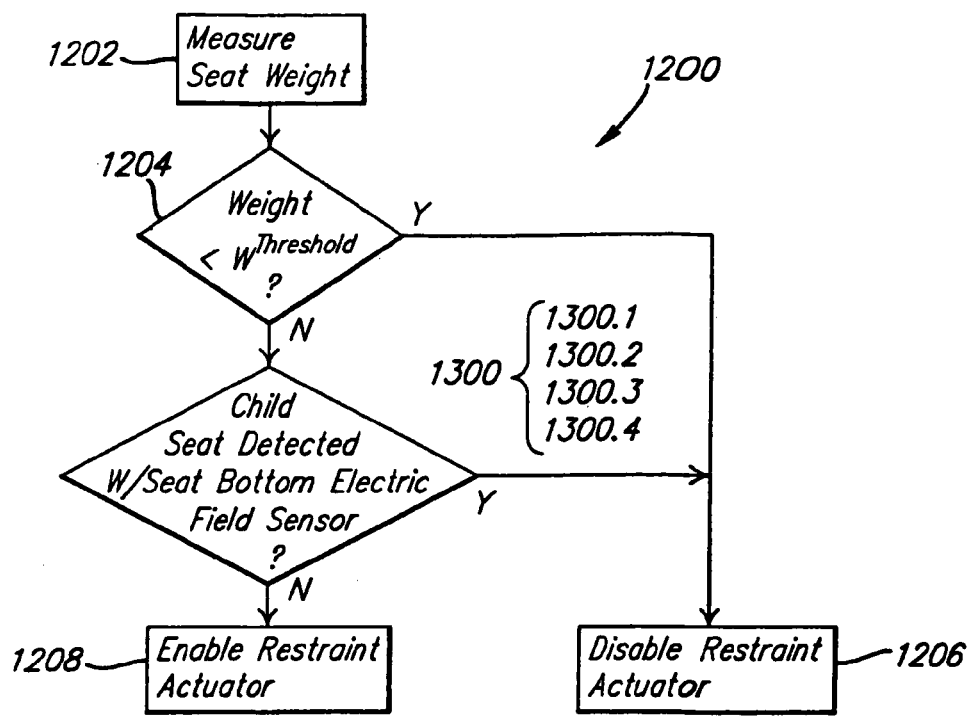
FIG. 12 illustrates a method of detecting an occupant and controlling a restraint actuator responsive thereto.

Referring to FIG. 12, in accordance with a method 1200 of detecting an occupant 18 and controlling a restraint actuator 44 responsive thereto, in step (1202), a measure of seat weight W is either provided by or generated responsive to a signal provided by the seat weight sensor 12. Then, in step (1204), if the measure of seat weight W is less than a corresponding weight threshold $W^{Threshold}$, then, in step (1206), the restraint actuator 44 is disabled. For example, the weight threshold $W^{threshold}$ is adapted to correspond to an upper bound of the weight of a small occupant (e.g. about 60 pounds or 27 Kilograms) that would be susceptible to injury from the deployment of the restraint actuator 44. Otherwise, from step (1204), if, in step (1300)—a method 1300 of detecting a child seat 302 on a vehicle seat 22,—a child seat 302 is detected on the vehicle seat 22 by the electric field sensor 14 in the seat bottom 24, then in step (1206), the restraint actuator 44 is disabled. Otherwise, the restraint actuator 44 is enabled. Accordingly, the restraint actuator 44 is disabled for either an empty vehicle seat 22, or for an occupant 18 on the vehicle seat 22 that is potentially at risk of injury from the deployment of the restraint actuator 44, e.g. a sufficiently small child, or a child in a child seat 302, e.g. a rear facing infant seat 304. Otherwise, in step (1208), the restraint actuator 44 is enabled, e.g. for a normally seated adult occupant 18 on the vehicle seat 22.

Figure 13:
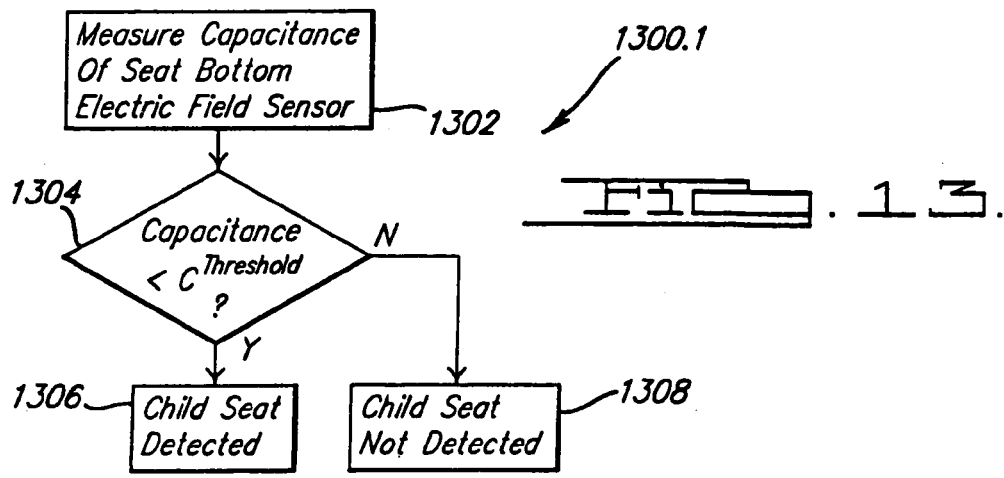
FIG. 13 illustrates a first method of detecting a child seat on a vehicle seat.

Referring to FIG. 13, in accordance with a first method 1300.1 of detecting a child seat 302 on a vehicle seat 22, in step (1302), the sensing circuit 48 generates a measure of the capacitance C of the at least one electrode 26 of the electric field sensor 14 in the seat bottom 24. The electrode 26 is adapted, e.g. as illustrated in FIGS. 3a, 3b, 4a or 4b, so that the capacitance thereof for a child seat 302 in the vehicle seat 22 is substantially less (i.e. by a detectable difference) than the capacitance of the electrode 26 for an occupant 18 seated on the vehicle seat 22. Then, in step (1304), if the measure of the capacitance C is less than a discrimination threshold $C^{Threshold}$, then in step (1306) a result is provided indicating that a child seat 302 has been detected. For example, for one particular electrode 26, the discrimination threshold $C^{Threshold}$ was about 10 picofarads. Otherwise, from step (1304), in step (1308), a result is provided indicating that a child seat 302 has not been detected.

The measurements of the seat weight sensor 12 and electric field sensor 14 as used in the above-described methods (1200, 1300) are, in one set of embodiments, actually differential measurements with respect to corresponding stored values of measurements for of an empty vehicle seat 22. For example, for a seat weight sensor 12 that measures the weight of the entire vehicle seat 22, the stored weight of the empty vehicle seat 22 is subtracted from the measured seat weight so as to provide the weight of the object on the vehicle seat 22, which is then used in the method 1200 of detecting an occupant 18 and controlling a restraint actuator 44 responsive thereto. Similarly, the stored capacitance measurement of the electric field sensor 14 for an empty seat is subtracted from the capacitance measurement of the electric field sensor 14, and this difference is used in the method 1300 of detecting a child seat 302 on a vehicle seat 22.

Whereas a seat weight sensor 12 alone might otherwise have difficulty distinguishing between the 60 lb. child on a 10 pound booster seat (child seat 302) from a small adult occupant 18, the electric field sensor 14 can distinguish between a child seat 302 and an adult occupant 18. Also, if the lap belt were cinched tight on a rear facing infant seat 304, the force on the seat may be very high, but the electric field sensor 14 can identify that there is no adult occupant 18 seated directly on the seat bottom 24. A child 300 is seated directly on the seat bottom 24 can be detected by the seat weight sensor 12.

Accordingly, the occupant detection system 10 provides for enabling actuation of the restraint actuator 44, responsive to a crash detected by the crash sensor 58, if the seat weight sensor 12 detects an occupant 18 (or object) of sufficient weight is on the vehicle seat 22, and if the electric field sensor 14 indicates that a child seat 302 is not on the vehicle seat 22. Otherwise, the restraint actuator 44 is disabled so as to not be actuated responsive to a crash detected by the crash sensor 58. A child seat 302 is typically secured to the vehicle seat 22 with a cinched seat belt than can cause a substantial force on the vehicle seat 22, of a magnitude that might otherwise be interpreted as an adult occupant 18. In this case, the seat weight sensor 12 and the electric field sensor 14 cooperate, wherein the electric field sensor 14 detects the presence of the child seat 320 responsive to an associated relatively low measure of capacitance so as to prevent the restraint actuator 44 from otherwise being enabled. The components of the seat weight sensor 12 and the electric field sensor 14 can all be incorporated in the vehicle seat 22 so as to provide for testing of the occupant detection system 10 in the vehicle seat 22 prior to assembly in the vehicle 20. Furthermore, electronics associated with the seat weight sensor 12, electric field sensor 14 and controller 16 can be incorporated in a common electronics module, or incorporated in separate electronics modules.

Figure 14:
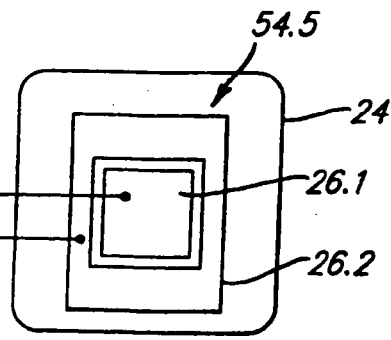
FIG. 14 illustrates an electric field sensor comprising a plurality of electrodes.

Referring to FIG. 14, the capacitive sensing pad 54.5 mountable within the seat bottom 24 is adapted to detect a child seat 302 thereon by incorporating a plurality of electrodes 26, i.e. first 26.1 and second 26.2 electrodes, wherein the first electrode 26.1 is located and shaped so as to principally sense a region where the gap 308 between the child 300 and the capacitive sensing pad 54.5 could be small, and the second electrode 26.2 senses the remaining portion of the seat bottom 24. Each of the first 26.1 and second 26.2 electrodes is either operatively connected to separate sensing circuits 48, or to separate multiplexed channels of a common sensing circuit 48, so that the one or more sensing circuits 48 provide separate first $C_1$ and second $C_2$ measures of capacitance of the respective first 26.1 and second 26.2 electrodes. If the total signal, i.e. the sum of $C_1$ and $C_2$, is relatively low and is dominated by the signal from the first measure of capacitance $C_1$, then the corresponding object on the vehicle seat 22 is likely a child seat 302, e.g. a rear facing infant seat 304.

Figure 15:
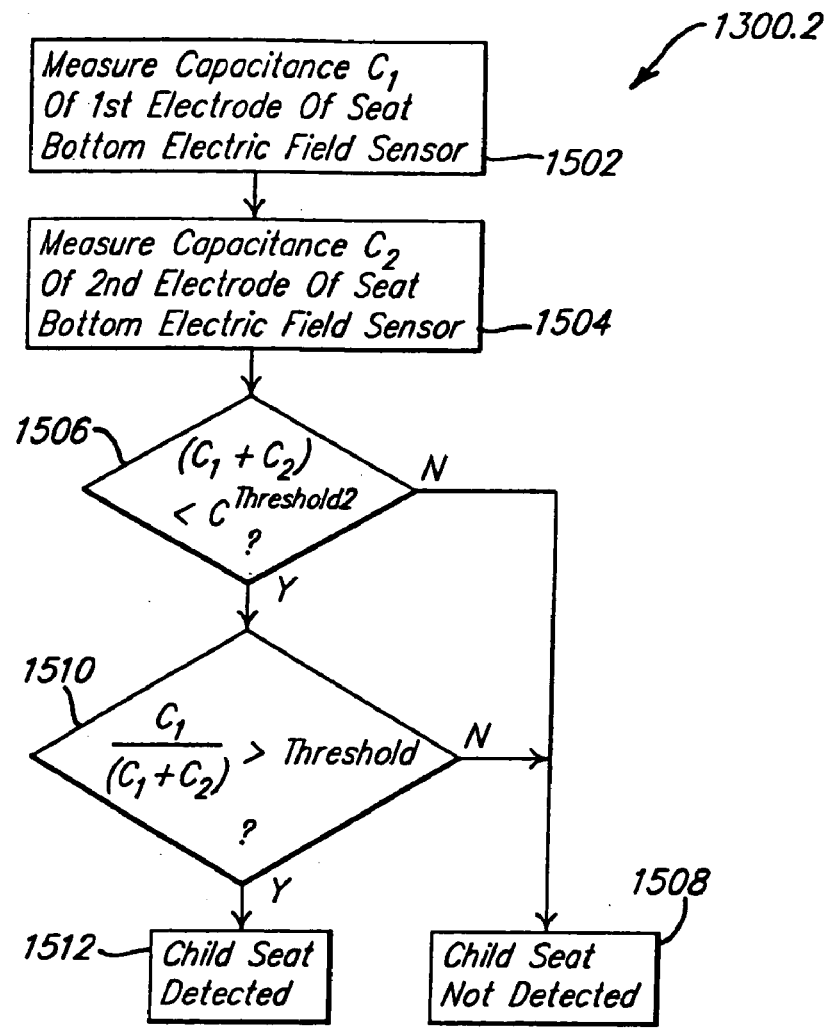
FIG. 15 illustrates a second method of detecting a child seat on a vehicle seat.

More particularly, referring to FIG. 15, in accordance with a second method 1300.2 of detecting a child seat 302 on a vehicle seat 22, in step (1502) the sensing circuit 48 generates a first measure of capacitance $C_1$ of the first 26.1 electrode, and in step (1504) the sensing circuit 48 generates a second measure of capacitance $C_2$ of the second electrode 26.2 of the electric field sensor 14 in the seat bottom 24. Then, in step (1506), if the total measure of capacitance $(C_1+C_2)$ is not less than a discrimination threshold $C^{Thresh}_{old2}$,—e.g. indicative of an occupant 18 likely seated directly on the vehicle seat 22—then in step (1508) a result is provided indicating that a child seat 302 has not been detected. Otherwise, in step (1510), if ratio of the first measure of capacitance $C_1$ of the first electrode 26.1— located so as to most proximate to the gap 308 of a child seat 302 when the child seat 302 is on the vehicle seat 22—to the total measure of capacitance $(C_1+C_2)$, is greater than a threshold, then in step (1512) a result is provided indicating that a child seat 302 has been detected. Otherwise, from step (1510), in step (1508), a result is provided indicating that a child seat 302 has not been detected.

Figure 16:
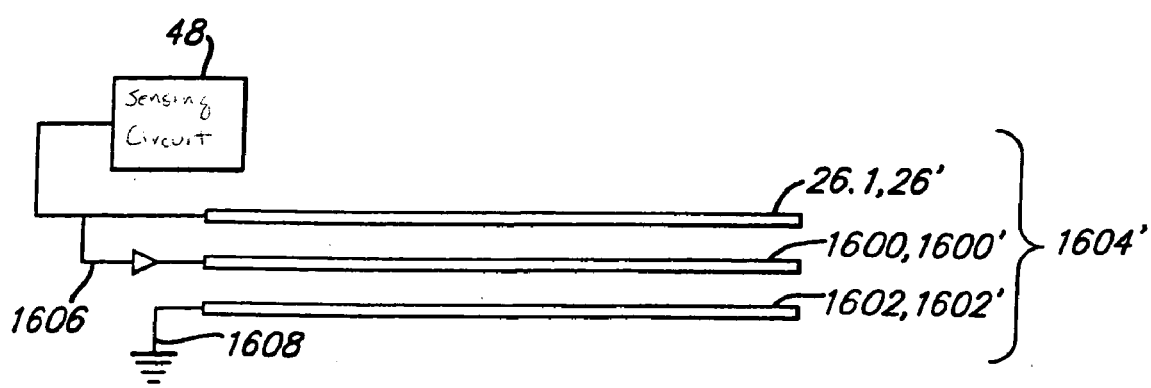
FIG. 16 illustrates a side-view of an embodiment of an electric field sensor incorporating a driven shield.

The electric field sensor 14 may be adapted to reduce the affect that liquids proximate to an electrode 26 can have on the capacitance thereof with respect to a circuit ground 52, or with respect to another electrode. For example, liquids spilled on and absorbed by the foam cushion 30 can increase the capacitance of an electrode 26 with respect to the circuit ground 52. Referring to FIG. 16, the electric field sensor 14 can be adapted to reduce the effect of a wetting of the foam cushion 30 by incorporating a third electrode 1600, known as a driven shield 1600', and/or a fourth electrode 1602, known as a ground plane 1602', under the at least one first electrode 26.1, known as a sense electrode 26', wherein the first 26.1, third 1600 and fourth 1602 electrodes are insulated from one another, for example by at least one dielectric substrate. For example, the first 26, third 1600 and fourth 1602 electrodes may be integrated so as to form a single capacitive sensing pad 1604'. The driven shield 1600' is a second conductor under the conductor of the sense electrode 26' that is driven at the same potential as the sense electrode 26', resulting in a cancellation of the electric field between the sense electrode 26' and the driven shield 1600'. The driven shield 1600' substantially eliminates the sensing capability of the capacitive sensing pad 704' on the side of the sense electrode 26' where the driven shield 1600' is located. A ground plane 1602' may be placed under the driven shield 1600' so that the circuit driving the driven shield 1600' drives a consistent load.

Accordingly, as so adapted, the electric field sensor 14 further comprises at least one third electrode 1600 and at least one fourth electrode 1602, wherein the at least one third electrode 1600 is located between the at least one first electrode 26.1 and the at least one fourth electrode 1602, and the at least one third electrode 1600 is operatively coupled to a second applied signal 1606. For example, the at least one third electrode 1600 is substantially the same size as the at least one first electrode 26.1; the second applied signal 1606 is substantially the same as the applied signal 46; the at least one fourth electrode 1602 is located between the at least one first electrode 26.1 and a foam cushion 30 of the vehicle seat 22; the at least one fourth electrode 1602 is substantially the same size as the at least one first electrode 26.1; and the at least one fourth electrode 1602 is operatively connected to a circuit ground 52, or to a third applied signal 1608, wherein the third applied signal 1608 is a circuit ground 52 potential.

The driven shield 1600' and/or ground plane 1602' are, for example, near to or slightly larger than the sense electrode 26', and are provided to minimize the effects of liquid in the foam cushion 30 below the driven shield 1600' and/or the ground plane 1602' on the capacitance of the sense electrode 26', rather than to extend the range and sensitivity of the electric field sensor. The driven shield 1600' and the sense electrode 26' essentially covers the entire area to be sensed on the vehicle seat 22. Alternately, a plurality of first electrodes 26.1 can be distributed sparsely across the vehicle seat 22, thereby covering a smaller area than the entire area to be sensed on the vehicle seat 22. Each electrode 26 can be embodied in a variety of sizes and shapes, and for a plurality of first electrodes 26.1, the arrangement thereof can be embodied in a variety of patterns.

Figure 17A:
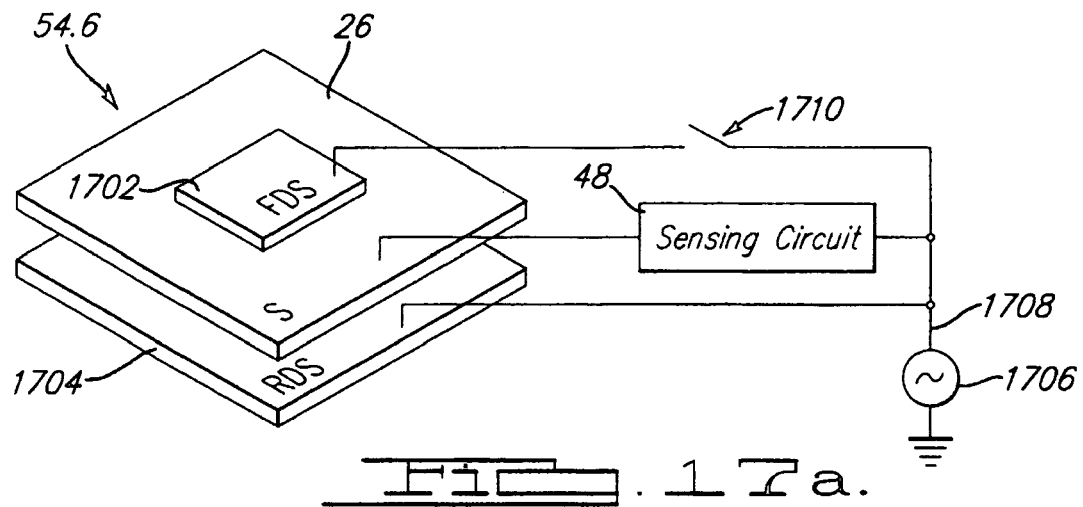
FIG. 17a illustrates an embodiment of a capacitive sensing pad comprising a front driven shield.
Figure 18A:
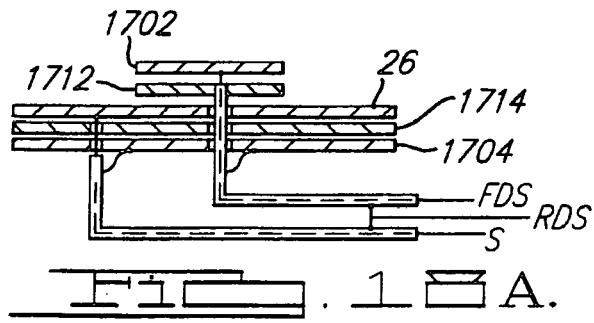

Referring to FIGS. 17*a* and 18*a*, a capacitive sensing pad 54.6 comprising a sense electrode (S) 26 may be adapted to provide similar functionality as the capacitive sensing pad 54.5 illustrated in FIG. 14 by incorporating a front driven shield (FDS) 1702 located and shaped similar to the first electrode 26.1 of the capacitive sensing pad 54.5 illustrated in FIG. 14. The front driven shield (FDS) 1702 is located on the side of the sense electrode (S) 26 that is to be sensed thereby. The capacitive sensing pad 54.6 further comprises a rear driven shield (RDS) 1704 that functions similar to the driven shield 1600' illustrated in FIG. 16. A signal generator 1706 provides an oscillatory signal 1708 that is coupled directly to the rear driven shield (RDS) 1704 and indirectly through the sensing circuit 48 to the sense electrode (S) 26. The oscillatory signal 1708 from the signal generator 1706 is also coupled through a switch 1710 to the front driven shield (FDS) 1702. When the switch 1710 is closed, the charge on the front driven shield (FDS) 1702 is substantially the same as on the corresponding region of the sense electrode (S) 26, thereby substantially shielding that region of the sense electrode (S) 26 from external influence. When the switch 1710 is open, the front driven shield (FDS) 1702 is electrically floating, thereby enabling an external electrostatic influence of the corresponding region of the sense electrode (S) 26. The front driven shield (FDS) 1702 is insulated from the sense electrode (S) 26 by a first insulator 1712, and the sense electrode (S) 26 is insulated from the rear driven shield (RDS) 1704 by a second insulator 1714.

Referring to FIGS. 19 and 20, in accordance with another embodiment, in a shielding mode, the front driven shield (FDS) 1702 is switched by a first switch 1716 ($S_1$) to a buffered version of the oscillatory signal 1708 so as to electrostatically shield the sense electrode (S) 26. In a sensing mode, the first switch 1716 ($S_1$) is opened, thereby disconnecting the front driven shield (FDS) 1702 from the oscillatory signal 1708, and the front driven shield (FDS) 1702 either is operatively connected to the sense electrode (S) 26 by closing a second switch 1718 ($S_2$) therebetween, as illustrated in FIG. 20; or is electrically floating, as illustrated in FIG. 21 and described hereinabove.

Referring to FIG. 22, the capacitive sensing pad 54.6 is operated in accordance with a third method 1300.3 of detecting a child seat 302 on a vehicle seat 22, wherein in step (2202), the front driven shield (FDS) 1702 is activated so as to shield the sense electrode (S) 26, and in step (2204) the sensing circuit 48 generates a second measure of capacitance $C_2$ of the sense electrode (S) 26. Then, in step (2206) the front driven shield (FDS) 1702 is deactivated, and in step (2208) the sensing circuit 48 generates third measure of capacitance $C_3$ of the sense electrode (S) 26. Then, in step (2210), if the total measure of capacitance $C_3$ is not less than a discrimination threshold $C^{Threshold2}$,—e.g. indicative of an occupant 18 likely seated directly on the vehicle seat 22—then in step (2212) a result is provided indicating that a child seat 302 has not been detected. Otherwise, in step (2214), if a ratio of a measure corresponding to the first measure of capacitance $C_1=C_3-C_2$ of the sense electrode (S) 26 to the total measure of capacitance $C_3$, is greater than a threshold, then in step (2216) a result is provided indicating that a child seat 302 has been detected. Otherwise, from step (2214), in step (2212), a result is provided indicating that a child seat 302 has not been detected.

Figure 17B:
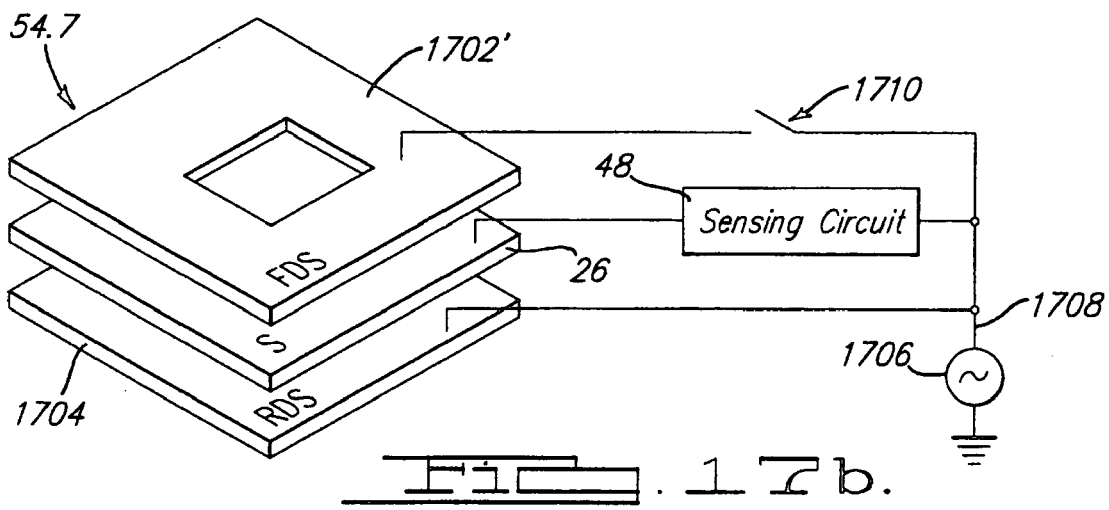
FIG. 17b illustrates another embodiment of a capacitive sensing pad comprising a front driven shield.
Figure 18B:
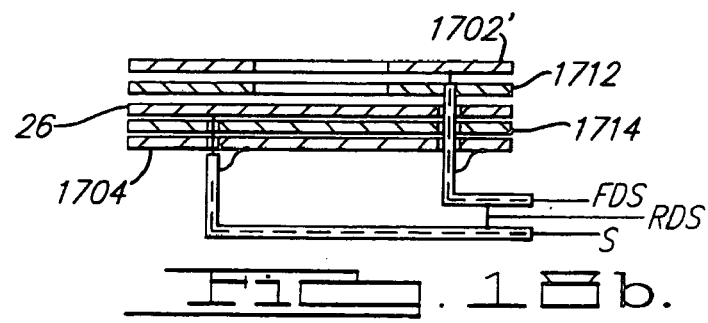
FIG. 18b illustrates a cross-section of the embodiment illustrated in FIG. 17b.

Referring to FIGS. 17*b* and 18*b*, a capacitive sensing pad 54.7 comprising a sense electrode (S) 26 may be adapted to provide similar functionality as the capacitive sensing pad 54.5 illustrated in FIG. 14 by incorporating a front driven shield (FDS) 1702' located and shaped similar to the second electrode 26.2 of the capacitive sensing pad 54.5 illustrated in FIG. 14. The front driven shield (FDS) 1702' is located on the side of the sense electrode (S) 26 that is to be sensed thereby. The capacitive sensing pad 54.7 further comprises a rear driven shield (RDS) 1704 that functions similar to the driven shield 1600', 1704 illustrated in FIGS. 16 and 17*a* respectively. A signal generator 1706 provides an oscillatory signal 1708 that is coupled directly to the rear driven shield (RDS) 1704 and indirectly through the sensing circuit 48 to the sense electrode (S) 26. The oscillatory signal 1708 from the signal generator 1706 is also coupled through a switch 1710 to the front driven shield (FDS) 1702'. When the switch 1710 is closed, the charge on the front driven shield (FDS) 1702' is substantially the same as on the corresponding region of the sense electrode (S) 26, thereby substantially shielding that region of the sense electrode (S) 26 from external influence. When the switch 1710 is open, the front driven shield (FDS) 1702' is electrically floating, thereby enabling an external electrostatic influence of the corresponding region of the sense electrode (S) 26. Alternately, the front driven shield (FDS) 1702' may be switched as illustrated in FIGS. 19 and 20. The front driven shield (FDS) 1702' is insulated from the sense electrode (S) 26 by a first insulator 1712, and the sense electrode (S) 26 is insulated from the rear driven shield (RDS) 1704 by a second insulator 1714.

Referring to FIG. 23, the capacitive sensing pad 54.7 is operated in accordance with a fourth method 1300.4 of detecting a child seat 302 on a vehicle seat 22, wherein in step (2302) the front driven shield (FDS) 1702' is activated so as to shield the sense electrode (S) 26, and in step (2304) the sensing circuit 48 generates a first measure of capacitance $C_1$ of the sense electrode (S) 26. Then, in step (2306) the front driven shield (FDS) 1702' is deactivated, and in step (2308) the sensing circuit 48 generates third measure of capacitance $C_3$ of the sense electrode (S) 26. Then, in step (2310), if the total measure of capacitance $C_3$ is not less than a discrimination threshold $C^{Threshold2}$,—e.g. indicative of an occupant 18 likely seated directly on the vehicle seat 22—then, in step (2312), a result is provided indicating that a child seat 302 has not been detected. Otherwise, in step (2314), if ratio of the first measure of capacitance $C_1$ of the sense electrode (S) 26 to the total measure of capacitance $C_3$, is greater than a threshold, then, in step (2316), a result is provided indicating that a child seat 302 has been detected. Otherwise, from step (2314), in step (2312), a result is provided indicating that a child seat 302 has not been detected.

Referring to FIGS. 24a and 24b, one potential source of inconsistent capacitance measurements is inconsistent coupling to circuit ground 52 by the occupant 18. The electric field sensor 14 is sensitive to this coupling because the magnitude of the capacitance being sensed is relatively low. The electric field sensor 14 measures the capacitance from the capacitive sensing pad 54 to circuit ground 52. Because the occupant 18 is very close to the capacitive sensing pad 54 and the occupant 18 may be fairly small, $C_{so}$, the capacitance between the capacitive sensing pad 54 and the occupant 18, may be large compared to $C_{og}$, the capacitance between the occupant 18 and circuit ground 52. In this case, the measurement of the capacitance from the capacitive sensing pad 54 to circuit ground 52 will be dominated by $C_{og}$ and the occupant 18 seated directly on the seat may be mistaken as a child seat 302.

Referring to FIG. 25, the capacitive sensing pad 54.8 can be adapted in accordance with the instant invention to provide consistently high $C_{og}$ values. A group of relatively small sense electrodes 2500 are distributed across the sensing area, with relatively small ground planes 2502 distributed therebetween. An occupant 18 seated directly on the vehicle seat 22 is seated close to both the sense electrodes 2500 and the ground planes 2502. Accordingly, $C_{og}$ will be consistently high such that the total capacitance from the capacitive sensing pad 54.8 to the circuit ground 52 will depend largely on $C_{so}$. The ground planes 2502 should be placed far enough away from the sense electrodes 2500 so that the corresponding range of capacitances of the capacitive sensing pad 54.8 is not overly reduced so that the electric field sensor 14.1 becomes impractical. This may require that the driven shield 2504 extend beyond the sense electrode 2502. The driven shield 2504 isolates the sense electrodes 2500 from the ground planes 2502. One of ordinary skill in the art will recognize that many variations of the capacitive sensing pad 54.8 are possible, and that the arrangement of FIG. 25 is illustrative and not limiting. The sense electrodes 2500, driven shield 2504 and ground planes 2502 may be located either on a common plane, or on separate planes in overlapping relationship with one another. The sense electrodes 2500 are operatively coupled to the sensing circuit 48, which measures the capacitance thereof with respect to the circuit ground 52.

Referring to FIG. 26, another embodiment of a capacitive sensing pad 54.9 with reduced sensitivity to a child seat 302 incorporates a sense electrode 2600 that comprises conductive strips 2602 spaced apart in a lattice 2604. The capacitive sensing pad 54.9 further comprises a ground plane 2606 that is located in the region of the electric field sensor 14 where, when mounted in the seat bottom 24, the gap 308 could be small between the seat bottom 24 and a child in a rear facing infant seat 304, so as to reduce the capacitance sensed when a rear facing infant seat 304 is located on the vehicle seat 22. Accordingly, the ground plane 2600 substantially reduces the affect of any object immediately above the area of the ground plane 2600, and precludes the need for a driven shield, as described hereinabove.

Referring to FIG. 27, illustrating results from tests of an electric field sensor 14 similar to that of FIG. 26—wherein the data was taken with human subjects seated either directly on the seat bottom 24 or in a child seat 302—there is a clear margin between any of the child seat 302 cases and the occupants 18 weighing over 100 lbs. While a seat weight sensor 12 may have difficulties distinguishing between the 60 pound child 300 on a 10 pound booster seat from a small adult occupant 18, the electric field sensor 14 will identify that there is no adult occupant 18 seated directly on the seat bottom 24, and the system would suppress the air bag inflator module 44'. Also, if the lap belt were very tight on a rear facing infant seat 304, the force on the vehicle seat 22 may be very high, but the electric field sensor 14 would identify that there is no adult occupant 18 seated directly on the seat bottom 24 and, again, the air bag inflator module 44' would be suppressed. If a child 300 is seated directly on the seat bottom 24, a seat weight sensor 12 generally provides a reliable measurement that can be used to control the air bag inflator module 44' deployment decision.

Referring to FIG. 28, in another embodiment of a capacitive sensing pad 54.10 with reduced sensitivity to a child seat 302, the sensor electrode 2800 comprises conductive strips 2802 spaced apart in a lattice 2804 that is terminated at a plurality of first terminals 2806, providing for improved redundancy and reliability. The first terminals 2806 are operatively coupled to the sensing circuit 48, which measures the capacitance at the first terminals 2806 with respect to circuit ground 52. A ground plane 2808 is terminated at a second terminal 2810, which is either operatively coupled to the sensing circuit 48, or directly coupled to circuit ground 52.

The ground planes 2606, 2808 in FIG. 26 and 28 can be switched "in or out" to gain extra information. For example, the ground planes 2606, 2808 could be left electrically floating, resulting in a relatively small affect on the measurement, or could be switched to circuit ground 52 to increase occupant-ground capacitance $C_{og}$. Additional information about the seat occupancy scenario can be obtained by switching between these two states. The relatively small area of the sense electrodes 2600, 2800 in FIG. 26 and 28 also reduces the sensor-occupant capacitance $C_{so}$ sufficiently so as to be significantly less than the occupant-ground capacitance $C_{og}$ so that the capacitance of the sense electrodes 2600, 2800 to circuit ground 52 is dominated by the sensor-occupant capacitance $C_{so}$.

Referring to FIG. 29, in another embodiment of a capacitive sensing pad 54.11 with reduced sensitivity to a child seat 302, the electric field sensor 14 may be adapted with a receive electrode 2900 for sensing a signal transmitted from a sense electrode 2902 when an occupant 18 is seated proximate to both the receive electrode 2900 and the sense electrode 2902. When the vehicle seat 22 is relatively wet, the foam cushion 30 may become saturated causing the electric field sensor 14 in the seat bottom 24 to identify an increase in signal large enough to represent an occupant directly on the seat. The receive electrode 2900 in the seat bottom 24 can be used to verify the occupant situation even when the seat is saturated with water. The receive electrode 2900 is preferably in the same plane as the sense electrode 2902, and the two electrodes 2900, 2902 are separated by a ground plane 2904 "gap". The ground plane 2904 also provides for reduced sensitivity proximate to locations on the vehicle seat 22 that would be closest to a child 300 in a child seat 302 thereon. The receive electrode 2900 senses the changes in the electric potential thereat caused by changes in potential induced on the sense electrode 2902 through capacitive coupling between the receive 2900 and sense 2902 electrodes. The amplitude of the signal from the receive electrode 2900 increase dramatically when there is a conductor coupling the receive 2900 and sense 2902 electrodes, as is the case when a human body part is well coupled to both electrodes 2900, 2902.

The relative amplitude of the signal from the receive electrode 2900 is also dependent upon the signal frequency if the vehicle seat 22/seat bottom 24/foam cushion 30 becomes wet. For example, a signal having a relatively high frequency, e.g. above about 1 Megahertz the signal is not conducted through the wet seat materials as well as a signal with a relatively low frequency (or long pulse length). A human body conducts is a relatively good conductor of the relatively high frequency signal. Accordingly, at frequencies above about 1 Megahertz, there can be a substantial difference between a signal received by the receive electrode 2900 in an empty wet vehicle seat 22 and a signal received by the receive electrode 2900 when an occupant 18 is seated directly on the vehicle seat 22 (regardless of whether the vehicle seat 22 is wet or dry).

Accordingly, the capacitive sensing pad 54.11 illustrated in FIG. 29 provides for two sensing modes as follows: 1) sensing a measure responsive to the capacitance of the sense electrode 2902, and 2) sensing a signal from the receive electrode 2900 that is coupled thereto from the sense electrode 2902 by an occupant 18. Although the second sensing mode can be preferable with respect to the first sensing mode when the vehicle seat 22 is wet, the first sensing mode is beneficial when the vehicle seat 22 is dry because of a relatively lower susceptibility to errors resulting from various complicating child seat 302 cases. For example, a relatively small piece of metal under the child seat 302 could cause the second sensing mode to misidentify the situation as an adult occupant 18 seated directly on the vehicle seat 22. Small, ungrounded conductors generally do not substantially influence the first sensing mode. Accordingly, both sensing modes used in combination provide for improved robustness of the electric field sensor 14. The effectiveness of a combination of the two sensing modes is improved when a wet vehicle seat 22 is properly identified and/or compensated, which can be done using frequency or phase characteristics of the associated signals when the vehicle seat 22 is wet, as is disclosed in U.S. Pat. No. 6,392,543, which is incorporated herein by reference. If the vehicle seat 22 is sufficiently wet to significantly influence the measurements, then the decision as to whether to deploy the restraint actuator 44 is based on the results of the second sensing mode. It is possible to further interdigitize the sense electrode 2902 and the receive electrode 2900 so as to ensure that an occupant 18 seated directly on the vehicle seat 22 will be coupled to both electrodes 2900, 2902 for most seating positions.

The seat weight sensor 12 and the electric field sensor 14 may be adapted to further cooperate with one another. For example, for a seat weight sensor 12 comprising a pressure sensing system that makes an assessment of the pressure pattern on the vehicle seat 22, the electric field sensor 14 can be used as an additional source of information to improve system robustness, e.g. so as to properly accommodate otherwise complicating situations such as when a towel is placed under a child seat 302. Furthermore, the electric field sensor 14 in the seat bottom 24 can be integrated with a seat weight sensor 12 comprising either a force sensing resistor or a bend sensors because both sensor technologies could be incorporated in the same sensing mat, possibly sharing one or more common conductive elements thereof.

Generally, the sense electrode 2200, 2600, 2800, 2902 of the capacitive sensing pad 54.8, 54.9, 54.10, 54.11 is distributed sparsely across the vehicle seat 22, thereby covering a smaller area than the entire area to be sensed on the vehicle seat 22. The capacitive sensing pad 54.8, 54.9, 54.10, 54.11, and the elements thereof, can be embodied in a variety of shapes.

While specific embodiments have been described in detail, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

What is claimed is:

1. An electric field sensor, comprising:
   at least one electrode;
   a first reference capacitor;
   a second reference capacitor; and
   a sensing circuit comprising a plurality of states, wherein in a first state said sensing circuit is operatively coupled to at least one said electrode so as to provide for generating a first signal responsive to the capacitance of said at least one said electrode, in a second state said sensing circuit is operatively coupled to said first reference capacitor so as to provide for generating a second signal responsive to the capacitance of said first reference capacitor, in a third state said sensing circuit is operatively coupled to said second reference capacitor so as to provide for generating a third signal responsive to the capacitance of said second reference capacitor, and said sensing circuit is adapted to provide for generating a measure responsive to the capacitance of said at least one said electrode responsive to said first signal, said second signal and said third signal.

2. An electric field sensor as recited in claim 1, wherein in said third state, said sensing circuit is also operatively coupled to said first reference capacitor so that said third signal is responsive to the capacitance of a combination of said first and second reference capacitors.

3. An electric field sensor as recited in claim 1, further comprising at least one switch operatively coupling said at least one electrode, said first reference capacitor and said second reference capacitor to said sensing circuit, wherein said first state, said second state, and said third state of said sensing circuit correspond to corresponding states of said at least one switch.

4. An electric field sensor as recited in claim 1, further comprising at least multiplexer or demultiplexer operatively coupling said at least one electrode, said first reference capacitor and said second reference capacitor to said sensing circuit, wherein said first state, said second state, and said third state of said sensing circuit correspond to corresponding states of said at least at least one multiplexer or demultiplexer.

5. An electric field sensor as recited in claim 1, wherein said plurality of states are repetitively sequentially cycled.

6. An occupant detection system in the seat of a vehicle, comprising:
   at least one electrode;
   a first reference capacitor;
   a second reference capacitor; and
   a sensing circuit comprising a plurality of states, wherein in a first state said sensing circuit is operatively coupled to at least one said electrode so as to provide for generating a first signal responsive to the capacitance of said at least one said electrode, in a second state said sensing circuit is operatively coupled to said first reference capacitor so as to provide for generating a second signal responsive to the capacitance of said first reference capacitor, in a third state said sensing circuit is operatively coupled to said second reference capacitor so as to provide for generating a third signal responsive to the capacitance of said second reference capacitor, and said sensing circuit is adapted to provide for generating a measure responsive to the capacitance of said at least one said electrode responsive to said first signal, said second signal and said third signal.

7. The occupant detection system of claim 6, wherein in said third state, said sensing circuit is also operatively coupled to said first reference capacitor so that said third signal is responsive to the capacitance of a combination of said first and second reference capacitors.

8. The occupant detection system of claim 6, further comprising at least one switch operatively coupling said at least one electrode, said first reference capacitor and said second reference capacitor to said sensing circuit, wherein said first state, said second state, and said third state of said sensing circuit correspond to corresponding states of said at least one switch.

9. The occupant detection system of claim 6, further comprising at least multiplexer or demultiplexer operatively coupling said at least one electrode, said first reference capacitor and said second reference capacitor to said sensing circuit, wherein said first state, said second state, and said third state of said sensing circuit correspond to corresponding states of said at least at least one multiplexer or demultiplexer.

10. The occupant detection system of claim 6, wherein said plurality of states are repetitively sequentially cycled.

11. A vehicle safety system comprising:
    an occupant detection system comprising:
    at least one electrode;
    a first reference capacitor;
    a second reference capacitor; and
    a sensing circuit comprising a plurality of states, wherein in a first state said sensing circuit is operatively coupled to at least one said electrode so as to provide for generating a first signal responsive to the capacitance of said at least one said electrode, in a second state said sensing circuit is operatively coupled to said first reference capacitor so as to provide for generating a second signal responsive to the capacitance of said first reference capacitor, in a third state said sensing circuit is operatively coupled to said second reference capacitor so as to provide for generating a third signal responsive to the capacitance of said second reference capacitor, and said sensing circuit is adapted to provide for generating a measure responsive to the capacitance of said at least one said electrode responsive to said first signal, said second signal and said third signal.

12. The vehicle safety system of claim 11, further comprising a controller configured to control the deployment of a restraint device, wherein in said third state, said sensing circuit is also operatively coupled to said first reference capacitor so that said third signal is responsive to the capacitance of a combination of said first and second reference capacitors.

13. The vehicle safety system of claim 11, further comprising at least one switch operatively coupling said at least one electrode, said first reference capacitor and said second reference capacitor to said sensing circuit, wherein said first state, said second state, and said third state of said sensing circuit correspond to corresponding states of said at least one switch.

14. The vehicle safety system of claim 11, further comprising at least multiplexer or demultiplexer operatively coupling said at least one electrode, said first reference capacitor and said second reference capacitor to said sensing circuit, wherein said first state, said second state, and said third state of said sensing circuit correspond to corresponding states of said at least at least one multiplexer or demultiplexer.

15. The vehicle safety system of claim 11, wherein said plurality of states are repetitively sequentially cycled.

\* \* \* \* \*